(12) United States Patent
Buer et al.

(10) Patent No.: US 9,847,766 B2
(45) Date of Patent: Dec. 19, 2017

(54) EQUALIZATION OF FREQUENCY-DEPENDENT GAIN

(71) Applicant: VIASAT, INC., Carlsbad, CA (US)

(72) Inventors: Kenneth V Buer, Gilbert, AZ (US); Michael R Lyons, Gilbert, AZ (US)

(73) Assignee: VIASAT, INC., Carlsbad, CA (US)

( * ) Notice: Subject to any disclaimer, the term of this patent is extended or adjusted under 35 U.S.C. 154(b) by 0 days.

(21) Appl. No.: 15/286,349

(22) Filed: Oct. 5, 2016

(65) Prior Publication Data
US 2017/0054426 A1 Feb. 23, 2017

Related U.S. Application Data

(63) Continuation of application No. 14/618,484, filed on Feb. 10, 2015, now Pat. No. 9,484,878.
(Continued)

(51) Int. Cl.
*H03G 3/30* (2006.01)
*H04B 3/14* (2006.01)
(Continued)

(52) U.S. Cl.
CPC ............. *H03G 3/3042* (2013.01); *H03F 3/19* (2013.01); *H03F 3/245* (2013.01);
(Continued)

(58) Field of Classification Search
CPC ...... H03G 3/3036; H03G 3/3042; H03F 3/19; H03F 2200/451; H04B 1/40;
(Continued)

(56) References Cited

U.S. PATENT DOCUMENTS

| 4,378,535 A | 3/1983 | Chiu et al. |
| 4,686,686 A * | 8/1987 | Nakayama ........ H04L 25/03019 333/18 |

(Continued)

FOREIGN PATENT DOCUMENTS

| EP | 2908441 A1 | 8/2015 | |
| FI | WO 03050967 A1 * | 6/2003 | ......... H03H 21/0001 |

(Continued)

OTHER PUBLICATIONS

Fejzuli et al., "Broadband Amplifier Gain Slope Equalization with a Single Passive Component", High Frequency Electronics, Jun. 2006, 3 pgs.
(Continued)

*Primary Examiner* — Devan Sandiford

(57) ABSTRACT

Systems, devices, and methods for determining and establishing frequency-dependent gain compensation in wide bandwidth communication systems are disclosed. Variable frequency-dependent gain compensation circuits, or variable equalizers, have settings that configure them to establish discrete frequency-dependent gain compensation. The frequency-dependent gain compensation can include various types and levels of gain slope and/or ripple. The settings of the variable equalizers can be set by control signals established a control circuit in response to signals from an external computer. The variable equalizers are coupled to other circuits or devices and the frequency-dependent gain of the combined circuit are measured. The settings of the variable equalizer are then changed to establish an optimal frequency-dependent gain profile or frequency-dependent gain that is closest to a predetermined frequency-dependent target gain profile. The settings can then be saved in a memory or register.

17 Claims, 12 Drawing Sheets

Related U.S. Application Data

(60) Provisional application No. 61/941,023, filed on Feb. 18, 2014.

(51) Int. Cl.

| | |
|---|---|
| *H03F 3/19* | (2006.01) |
| *H04B 1/40* | (2015.01) |
| *H04B 7/185* | (2006.01) |
| *H04L 25/03* | (2006.01) |
| *H03F 3/24* | (2006.01) |

(52) U.S. Cl.
CPC ............. *H03G 3/3036* (2013.01); *H04B 1/40* (2013.01); *H04B 3/145* (2013.01); *H04B 7/1853* (2013.01); *H04L 25/03878* (2013.01); *H03F 2200/451* (2013.01)

(58) Field of Classification Search
CPC ...... H04B 7/1853; H04B 3/145; H04B 3/141; H04B 3/148; H04L 25/03878; H04L 27/01
See application file for complete search history.

(56) References Cited

U.S. PATENT DOCUMENTS

| | | | | |
|---|---|---|---|---|
| 4,797,898 | A * | 1/1989 | Martinez | ................ H04B 3/141 |
| | | | | 375/219 |
| 4,870,658 | A * | 9/1989 | Suzuki | ................... H04B 3/145 |
| | | | | 333/18 |
| 4,967,169 | A | 10/1990 | Sun et al. | |
| 5,708,703 | A | 1/1998 | Nagaraj | |
| 7,693,490 | B2 * | 4/2010 | Gagnon | ................... H04B 3/14 |
| | | | | 455/3.06 |
| 8,170,511 | B2 | 5/2012 | Kerselaers | |
| 9,484,878 | B2 | 11/2016 | Buer et al. | |
| 2005/0002479 | A1 | 1/2005 | Tripathi et al. | |
| 2006/0182171 | A1 | 8/2006 | Kuijk et al. | |
| 2008/0310654 | A1 * | 12/2008 | Jambor | ..................... H03G 5/04 |
| | | | | 381/120 |
| 2010/0124265 | A1 | 5/2010 | Shakiba et al. | |
| 2014/0253249 | A1 | 9/2014 | Low | |
| 2015/0236663 | A1 | 8/2015 | Buer et al. | |
| 2017/0195146 | A1 * | 7/2017 | Greene | ............ H04L 25/03878 |

FOREIGN PATENT DOCUMENTS

| | | |
|---|---|---|
| JP | 2001-016145 A | 1/2001 |
| WO | WO-00/42715 A2 | 7/2000 |

OTHER PUBLICATIONS

Hwang et al., "A New Type of Amplitude Equalizer for In-band Flatness Improvement", Microwave Journal, Feb. 1, 2002, 8 pgs.

Thomber, "Amplitude Equalizer Flattens Gain From 50 MHz to 7 GHz", Microwaves & RF, Oct. 7, 2011, 7 pgs.

Extended European Search Report mailed in European Patent Application No. 15155134.8 dated Jun. 29, 2015, 9 pgs.

* cited by examiner

EQUALIZATION OF FREQUENCY-DEPENDENT GAIN

CROSS-REFERENCE TO RELATED APPLICATIONS

This application is a continuation of U.S. Non-Provisional application Ser. No. 14/618,484 filed 10 Feb. 2015, entitled "Equalization of Frequency-Dependent Gain", and claims the benefit of U.S. Provisional Application No. 61/941,023 filed 18 Feb. 2014, entitled Equalization of Frequency-Dependent Gain, which are incorporated by reference herein.

BACKGROUND

The present disclosure is generally related to wireless communication, and in particular, to frequency-dependent gain compensation in microwave and radio frequency transmitters and receivers.

Unless otherwise indicated herein, the approaches described in this section are not admitted to be prior art by inclusion in this section.

Satellite-based and other wireless communication systems can be used to deploy communication network access to areas without the terrestrial infrastructure to support other forms of network connectivity (e.g., telephone or DSL lines, cable lines, fiber optic lines, etc.). For example, satellite networks can be deployed to provide internet access to wide regions of users that are either mobile or too remote for wired connections to be feasible. Similarly, point-to-point wireless data communication systems (e.g., microwave transceiver networks) can be used to connect computer networks of two or more geographically separated facilities to enable increased connectivity and data sharing between computer systems and users in those networks.

Connections using wireless communication systems can be deployed more quickly and, in some instances, at lower costs relative to installing traditional wired or fiber optic connections. However, due to the bandwidth limitations and latency issues of traditional wireless connections relative to the wide bandwidth capabilities of wired or fiber optic connections, wireless systems have often been used as connections of last resort. For instance, users in remote areas typically have limited options. Such users may have access to traditional telephone and dial-up data services over a public switched telephone network (PSTN). But because PSTNs may have limited quality and reliability in such remote areas, many remote users may resort to satellite-based wireless connections for data or Internet access. Traditionally, such satellite-based wireless connections have offered only marginal performance improvements over dial-up type services, but with the advantages of improved reliability (i.e., availability and uptime). However, such advantages can be costly.

Since each location's hardware (e.g., modem, transceiver, antenna, etc.) must be installed and aligned individually, the cost of installation, especially in remote areas, may be significant. In addition, because of the small user base and traditionally narrow bandwidths, conventional satellite communications systems have yet to achieve economies of scale. Consequently, installation and subscription costs for satellite based wireless connections can be prohibitive for many casual users.

Recently, the speed and bandwidth of various satellite-based and other wireless connections have increased significantly. Satellite systems with increased bandwidths, improved spot beam handling, and frequency reuse, have improved the data capacity and the speed of satellite communication to the point that some systems are now competitive with traditional wired high speed connections in terms of both cost and performance.

SUMMARY

Embodiments of the present disclosure include systems, methods, and devices for improved frequency-dependent gain compensation in wireless communication. One embodiment includes a variable gain compensation circuit to establish a variable frequency-dependent gain, and a control circuit that includes an input terminal and is coupled to the variable gain compensation circuit. The control circuit can be configured to control the variable frequency-dependent gain of the variable gain compensation circuit in response to a signal received on the input terminal from an external source.

In one embodiment, the control circuit further comprises a register. The control circuit establishes a control signal to control the variable frequency-dependent gain of the variable gain compensation circuit in accordance with a predetermined setting stored in the register.

In one embodiment, the variable gain compensation circuit comprises a plurality of N variable gain compensation devices to establish a plurality of N corresponding component variable frequency-dependent gains. The variable frequency-dependent gain of the variable gain compensation circuit is a composite of at least some of the plurality of the N component variable frequency-dependent gains.

In one embodiment, the plurality of N variable gain compensation devices are the same and the corresponding plurality of N component variable frequency-dependent gains are approximately equal to each other.

In one embodiment, at least one of the plurality of N variable gain compensation devices is different from at least one other of the plurality of N variable gain compensation devices, and wherein at least one of the corresponding plurality of N component variable frequency-dependent gains is different from at least one other of the plurality of N component variable frequency-dependent gains.

In one embodiment, the variable gain compensation circuit comprises a plurality of M possible configurations to establish a plurality of M corresponding discrete frequency-dependent gains.

Another embodiment includes a transceiver circuit that includes a transmit path comprising a first variable gain compensation circuit to establish a variable frequency-dependent transmit gain, a receive path comprising a second variable gain compensation circuit to establish a variable frequency-dependent receive gain, and a control circuit comprising an input terminal coupled to the first variable gain compensation circuit and the second variable gain compensation circuit. The control circuit can be configured to control the variable frequency-dependent transmit gain of the first variable gain compensation circuit and the variable frequency-dependent receive gain of the second variable gain compensation circuit in response to a signal received on the input terminal from an external source.

In some embodiments, the transmit path includes a first plurality of signal processing devices, wherein the variable frequency-dependent transmit gain of the first variable gain compensation circuit is set in response to a first frequency-dependent gain of the first plurality of signal processing devices. In some embodiments, the receive path includes a second plurality of signal processing devices, wherein the variable frequency-dependent receive gain of the second variable gain compensation circuit is set in response to a second frequency-dependent gain of the second plurality of signal processing devices.

Yet another embodiment includes a method of equalizing frequency-dependent gains in an integrated circuit. The method can include providing a plurality of signal processing devices, defining a transmit path through a first subset of the plurality of signal processing devices, defining a receive path through a second subset of the plurality of signal processing devices, coupling a first variable gain compensation circuit to the transmit path, and coupling a second variable gain compensation circuit to the receive path.

In one embodiment, the method can also determining a first frequency-dependent gain through the transmit path, determining a second frequency-dependent gain through the receive path, configuring the first variable gain compensation circuit in response to the first frequency-dependent gain of the transmit path to establish a compensating frequency-dependent transmit gain, and configuring the second variable gain compensation circuit in response to the second frequency-dependent gain of the receive path to establish a compensating frequency-dependent receive gain.

In one embodiment, configuring the first variable gain compensation circuit comprises selecting one of a plurality of M discrete settings for the first variable gain compensation circuit, and wherein configuring the second variable gain compensation circuit comprises selecting one of a plurality of N discrete settings for the second variable gain compensation circuit.

The following detailed description and accompanying drawings provide a better understanding of the nature and advantages of the present invention.

DETAILED DESCRIPTION

Figure 1:
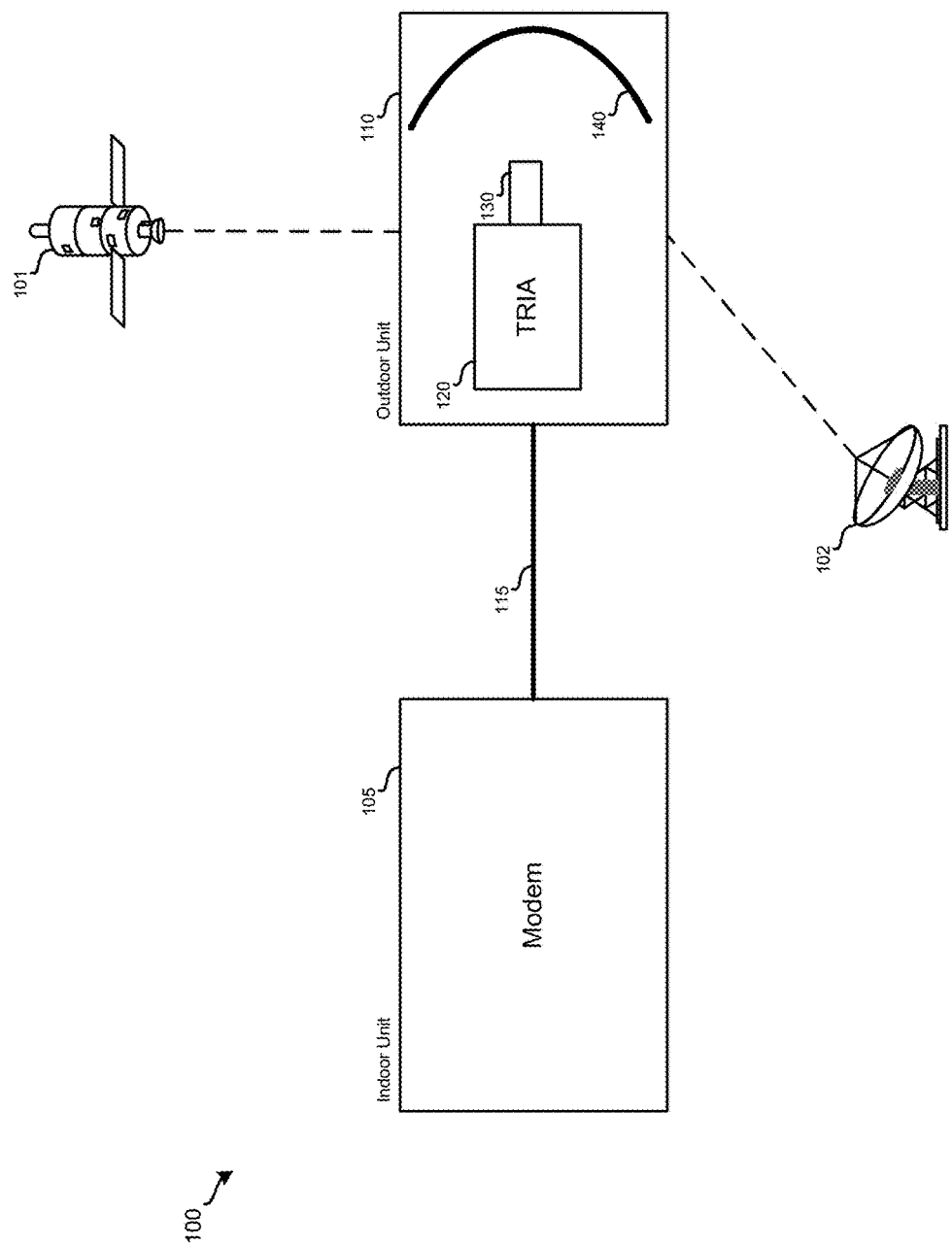
FIG. 1 is a schematic of a communication device according to various embodiments of the present disclosure.

The present disclosure pertains to wireless and satellite communication devices, methods, and systems, and in particular to techniques for equalizing frequency-dependent gain in signal processing devices, such as transceivers and transmit/receive integrated assemblies (TRIAs). Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

In describing the present disclosure, the following terminology will be used: The singular forms "a," "an," and "the" include plural referents unless the context clearly dictates otherwise. Thus, for example, reference to an item includes reference to one or more items. The term "ones" refers to one, two, or more, and generally applies to the selection of some or all of a quantity. The term "plurality" refers to two or more of an item. The term "device" may refer to one functional unit, which may include one or multiple functional sub-units. The term "about" means quantities, dimensions, sizes, formulations, parameters, shapes and other characteristics need not be exact, but may be approximated and/or larger or smaller, as desired, reflecting acceptable tolerances, conversion factors, rounding off, measurement error and the like and other factors known to those of skill in the art. The term "substantially" means that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide. Numerical data may be expressed or presented herein in a range format. It is to be understood that such a range format is used merely for convenience and brevity and thus should be interpreted flexibly to include not only the numerical values explicitly recited as the limits of the range, but also interpreted to include all of the individual numerical values or sub-ranges encompassed within that range as if each numerical value and sub-range is explicitly recited. As an illustration, a numerical range of "about 1 to 5" should be interpreted to include not only the explicitly recited values of about 1 to about 5, but also to include individual values and sub-ranges within the indicated range. Thus, included in this numerical range are individual values such as 2, 3 and 4 and sub-ranges such as 1-3, 2-4 and 3-5, etc. This same principle applies to ranges reciting only one numerical value (e.g., "greater than about 1") and should apply regardless of the breadth of the range or the characteristics being described. A plurality of items may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. Furthermore, where the terms "and" and "or" are used in conjunction with a list of items, they are to be interpreted broadly, in that any one or more of the listed items may be used alone or in combination with other listed items. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X employs A or B" is satisfied under any of the foregoing instances. The term "alternatively" refers to selection of one of two or more alternatives, and is not intended to limit the selection to only those listed alternatives or to only one of the listed alternatives at a time, unless the context clearly indicates otherwise.

Overview

Embodiments of the present disclosure include systems, devices, and methods for compensating for frequency-dependent gain in electronic devices. One example embodiment includes a variable frequency-dependent gain compensation circuit. The variable frequency-dependent gain compensation circuit can be set to establish a particular frequency-dependent gain to compensate for frequency-dependent gain of other components and devices to which it is coupled. For example, a variable frequency-dependent gain compensation circuit can be coupled to and set to compensate for the frequency-dependent gain in a particular signal processing circuit or device (e.g., a transceiver module). In one embodiment, one or more variable frequency-dependent gain circuits can be implemented in an integrated circuit (IC). In another embodiment, one or more variable frequency-dependent gain circuits can be implemented in monolithic microwave integrated circuit (MMIC). As used herein, implementing a circuit in a particular form factor can include fabricating the circuit (i.e., fabricating the circuit as an IC or MMIC). Such integrated circuits can be coupled to other components in a particular device and set to compensate for the frequency-dependent gain of the components in the device.

In one example embodiment, a particular signal processing device (e.g., a transmitter, a receiver, a transceiver, a TRIA, etc.) may include a number of different signal processing components, such as frequency conversion circuits, amplifiers, and the like, each with its own frequency-dependent gain. The combination of the frequency-dependent gains of the components can result in a frequency-dependent gain. The characteristics of the frequency-dependent gain may not be ideal or acceptable for a particular purpose.

For instance, for transmission of wireless communication signals in microwave and RF frequencies, frequency-dependent gain with excessive gain slope or ripple requires increased dynamic range in the signal to avoid clipping the signals in the frequencies with more gain and losing the signals in the noise in the frequencies with less gain. Increasing the dynamic range of a particular system may be undesirable or untenable for various reasons. For example, the additional power required for boosting the dynamic range may be impossible, or at least unsustainable, given the type or amount of available power (e.g., a solar or battery powered system). Accordingly, variable frequency-dependent gain compensation circuits can be set to have complementary frequency-dependent gain to adjust the frequency-dependent gain of the device to an acceptable uniformity or flatness. In some embodiments, acceptable uniformity or flatness may be defined as a total range of gain from maximum gain to minimum gain (e.g., a range of 4 dB from maximum to minimum).

In one embodiment, the variable frequency-dependent gain circuit coupled to a particular device or circuit can be set to establish a composite frequency-dependent gain that is substantially flatter (i.e., less steep gain slope or smaller gain ripple) than the frequency-dependent gain of the components in the particular device or circuit without the variable frequency-dependent gain circuit. When the composite frequency-dependent gain of the system is flatter, then the dynamic range can be improved, providing various performance benefits. On the transmission side, improved dynamic range can help reduce power consumption. For example, improvements to the dynamic range in a receiver or a receive path of a circuit resulting from flatter gain response increases its efficacy when receiving and processing weaker signals. Weaker signals can be detected and differentiated even in the presence of much stronger signals at nearby frequencies without the need for RF filtering, which can be large, expensive, or impractical (i.e., the nearby frequencies may be too close to the desired signal to filter effectively in the RF domain). In addition, improved dynamic range may also allow for signals at adjacent frequency bands to be down-converted without distortion. The undistorted down-converted signals can then be sampled, digitally filtered, and processed. Improved dynamic range can also prevent intentional or unintentional jamming from interference sources at nearby frequencies since the receiver is able to process both large interference signals and small desired signals at the same time with less distortion. Improved dynamic range can also result in lower distortion from adjacent carriers of similar signal strength which can improve the effective signal to noise and interference ratio.

In one embodiment, the variable frequency-dependent gain circuit can be controlled by an external source (e.g., a testing computer) to iteratively determine the optimal settings given the frequency-dependent gain of the particular device or circuit to which it is coupled. In other embodiments, the optimal settings for the variable frequency-dependent gain circuit can be stored in a register, or other memory, and used to set the variable frequency-dependent gain of the variable frequency-dependent gain circuit.

These and other embodiments of the present disclosure are described in more detail below.

Wireless Communication Systems and Devices

FIG. 1 illustrates a wireless communication system 100 that can be improved by various embodiments of the present disclosure. The wireless communication system 100 may be deployed at both end user locations and service provider locations. As shown, the wireless communication system 100 may be implemented as a two-part indoor/outdoor system. For example, the indoor unit 105 may be installed in the interior of an end user's building and connected to various other electronic devices that use the wireless communication system 100 to exchange signals with a remote wireless communication partners. The outdoor unit 110 may be installed on the exterior of the building (e.g., on a rooftop, or side of the building) with line of sight or unobstructed views of remote wireless communication partners, such as satellite 101, wireless access point 102, and the like.

The indoor unit 105 may include a modem, and other components, that can be connected to a router or computing device using one or more network communication protocols or media (e.g., Ethernet, Wi-Fi, etc.). The outdoor unit 110 may include the components for transmitting/receiving electromagnetic signals at various frequencies. The transmitting/receiving components may include transmission devices and receiving devices used in combination with an antenna 140. In the particular example shown, the transmitting/receiving components in outdoor unit 110 may include a transmit-receive integrated assembly (TRIA) 120. The TRIA 120 may include electronic components forming a transmission path coupled to one or more transmission antenna elements, and electronic components forming a receive path coupled to one or more receive antenna elements. The transmission antenna elements and the receive path antenna elements may be coupled to one or more types of open-ended waveguide type antennas 130, such as horn antennas. When combined with a reflector antenna 140, the TRIA 120 and antenna 130 combination can be configured to send and receive electronic signals to/from discrete locations over particular angles of transmission and acceptance. For example, the outdoor unit 110 may be aimed at particular source or target, such as a geostationary satellite 101 or terrestrial access point 102, to send/receive signals exclusively to/from that target or source.

In such configurations, the indoor unit 105 and the outdoor unit 110 may be coupled to one another by connection 115. In one embodiment, the connection 115 may include a flexible waveguide such as coaxial cable or a twisted-pair cable (e.g., CAT5 cable). In some embodiments, the connection 115 may also include power transmission capabilities for providing electrical power to the outdoor unit 110. For example, the connection 115 may include a CAT5 cable configured to deliver power over Ethernet.

Figure 2:
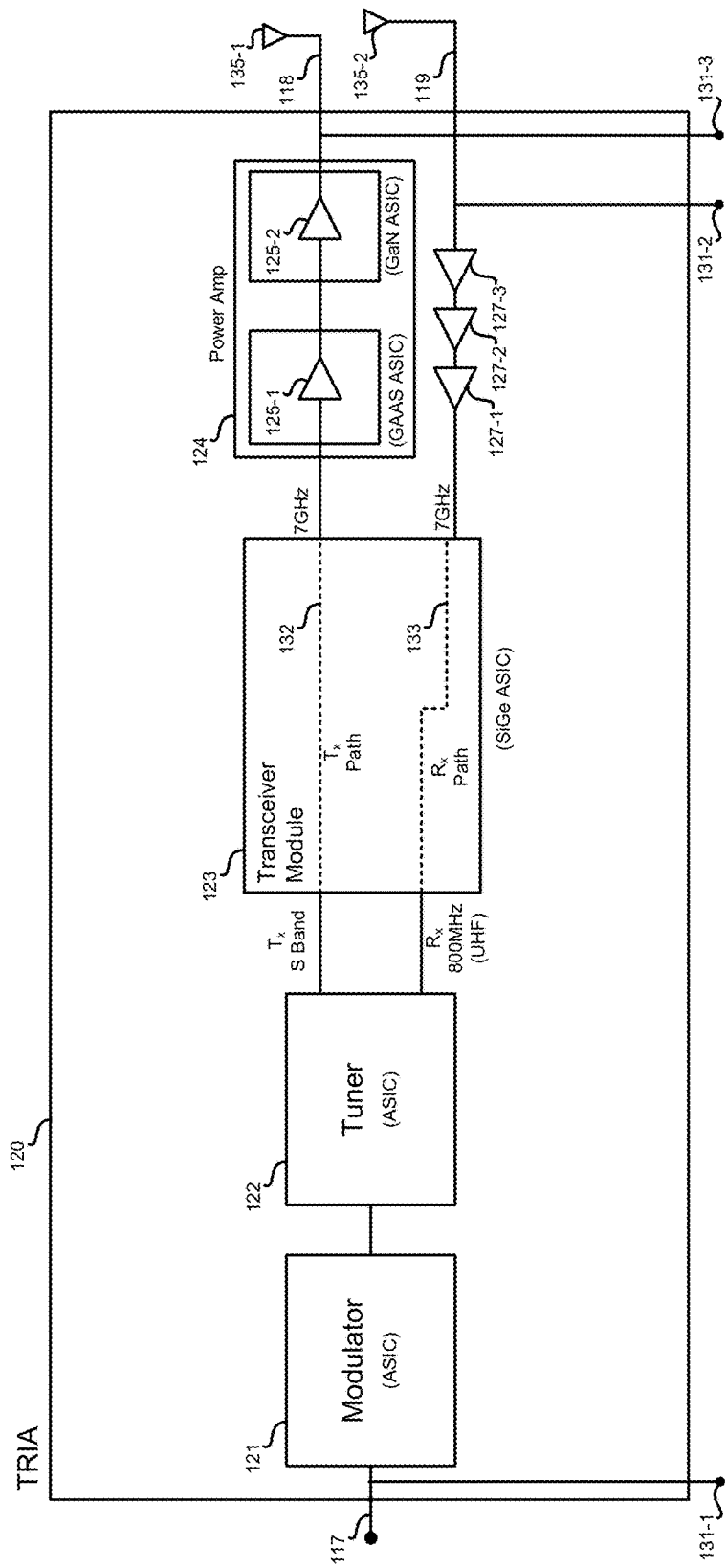
FIG. 2 is a schematic of a transmit receive integrated assembly (TRIA) that can be improved by various embodiments of the present disclosure.

FIG. 2 illustrates a particular example implementation of a TRIA 120 to illustrate various components that can contribute to the frequency-dependent gain of a system or device as a whole. The TRIA 120 may include a terminal 117 coupled to indoor unit 110 through the connection 115. Signals received on terminal 117 can be processed by the various components of the TRIA 120 and output on transmission terminal 118 and one or more transmission antenna elements 135-1. The TRIA 120 may also include a receive terminal 119 coupled to one or more receive antenna elements 135-2. Electromagnetic signals received through the receive terminal 119 via one or more receive antenna elements 135-2 can be processed by the various components of the TRIA 120 and output on terminal 117 and sent to the indoor unit 105 over connection 115.

The TRIA may include any number of components, such as signal processing circuits, power conditioning circuits, memories, control circuits, and the like. As shown, the TRIA 120 can include a modulator 121, a tuner 122, and a transceiver module 123. The transceiver module 123 may include a transmission path 132 and a receive path 133. Transmission path 132 of the transceiver module 123 may be coupled to a power amplifier 124. In one particular embodiment, the power amplifier 124 may include component amplifier modules 125-1 and 125-2. The component amplifier module 125-1 may include a gallium arsenide (GaAs) application-specific integrated circuit (ASIC) amplifier, while the component amplifier module 125-2 may include a gallium nitride (GaN) ASIC amplifier. The receive path 133 of the transceiver module 123 may be coupled to one or more low noise amplifiers (LNAs) 127. In some embodiments, the receive antenna element 135-2 may include multiple antennas for receiving signals having various polarizations. In such embodiments, each polarization may include its own set of LNAs 127 and corresponding receive paths 133.

Signals received on the input 117 by the TRIA 120 from the indoor unit 110 can be fed into modulator 121. Modulator 121 can generate a modulated signal on one or more carrier signals with the received signals. The received signals may include analog and/or digital signals. The modulated signal can then be fed into the tuner 122 to convert the modulated signal to the desired frequency used by the transceiver module 123. In the particular example shown, the tuner 122 can convert the modulated signal into an S band signal. The transceiver module 123 can receive the transmission signal on an input of its transmission path 132. The transmission path 132 can process the transmission signal according to the requirements of the specific application in which the TRIA 120 is implemented. For example, the transmission path 132 can include a number of signal conversion device or circuits to convert the input signal from one frequency to another frequency. In this particular example, the transmission path 132 of the transceiver module 123 converts the transmission signal from S band frequencies to approximately 7 GHz. The transmission path 132 may also include a number of amplifiers and/or conditioning circuits to amplify and/or condition the converted transmission signal. The converted transmission signal can then be fed into the power amplifier 124. The power amplifier 124 can amplify the converted transmission signal and output the amplified signal on output terminal 118 coupled to transmission antenna element 135-1.

On the receive side of the TRIA 120, electromagnetic signals received on terminal 119 through receive antenna element 135-2 can be amplified and filtered using the various LNAs 127. The amplified received signals can be fed into the receive path 133 of the transceiver module 123 to process the received signal according to the requirements of the specific application in which the TRIA 120 is implemented. The receive path 133 may include a number of signal conversion devices or circuits to convert the received signal from one frequency to another. For example, the receive path 133 can convert the received 7 GHz signal into an 800 MHz signal (UHF). Similar to the transmission path 132, the receive path 133 may also include a number of amplifiers and/or conditioning circuits to amplify and/or condition the received signal. The converted received signal can then be fed into the tuner 122 and the modulator 121 to convert signal into a format that can be used by the indoor unit 110.

Each of various components of the TRIA 120 may have a particular frequency-dependent response to a given transmission or receive signal. For the sake of clarity and brevity, the term "signal" will be used to refer to any transmission or receive signal processed by one of the components of the TRIA 120. Such signals may include various frequencies and/or frequency bands in a particular bandwidth of frequencies. As any one or more of the components of the TRIA 120 process signals at various frequencies, the signal may be either amplified or attenuated based on the response of the components to the particular frequencies in the signal. This response is referred to herein as "frequency-dependent gain". Based on the frequency-dependent gain of each component device and circuit, the TRIA 120, or other device, can have a frequency-dependent gain that includes the frequency-dependent gain contributions of the components devices and circuits. Accordingly, the transmission path 132 may have one frequency-dependent gain profile, while the receive path 133 133 may have a different frequency-dependent gain profile. The frequency-dependent gain profile of either path can be determined by measuring the frequency-dependent gain between the terminals 131-1, 131-2 and/or 131-3 of the TRIA 120. Accordingly, the frequency-dependent gain for the transmission path 132 and the receive path 133 can be determined independently.

Figure 3:
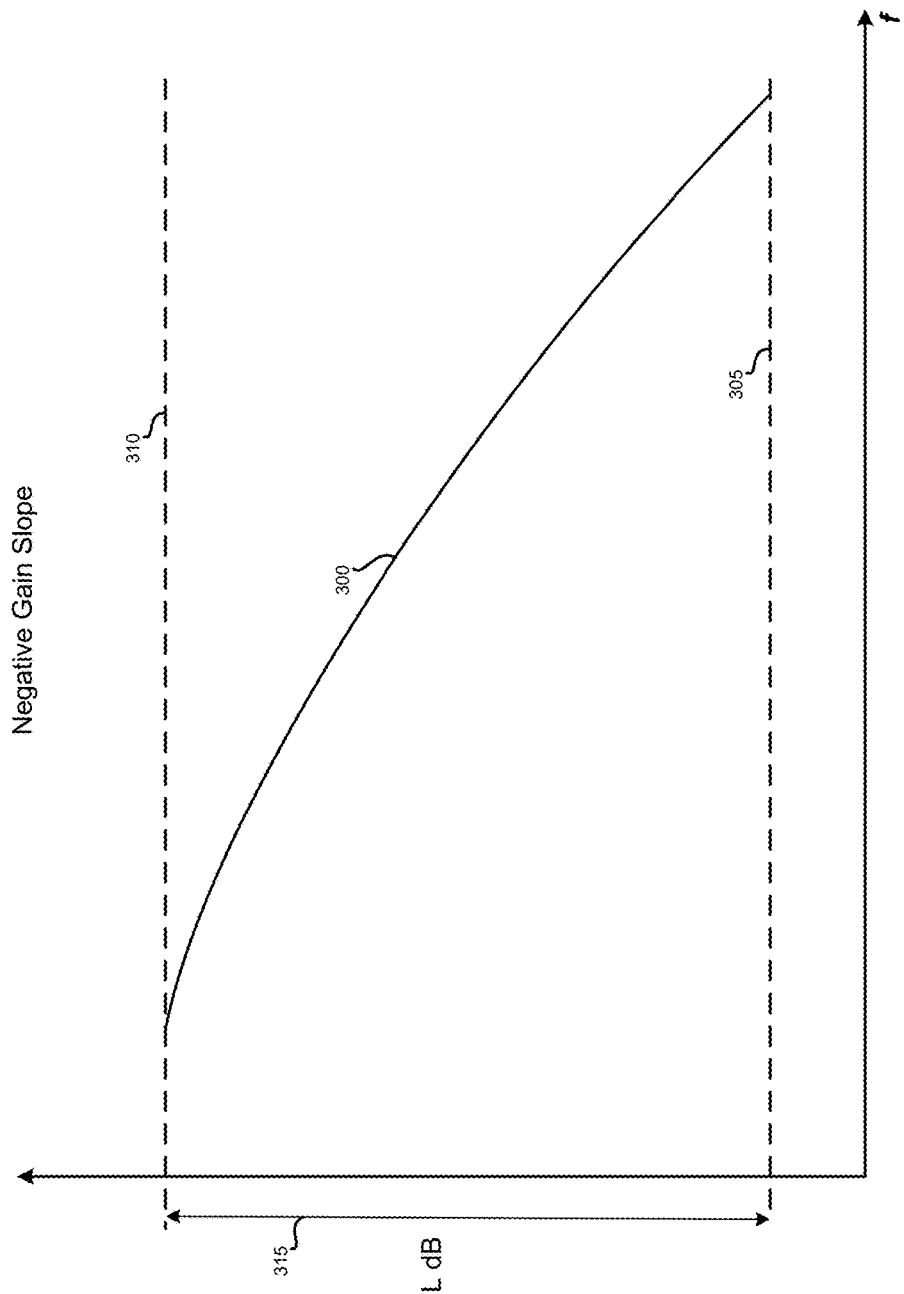
FIG. 3 is an example graph of a frequency-dependent gain profile with negative gain slope.

In general, gain can be measured in decibels (dB) relative to the input signal. Circuits and devices establish different levels of gain for different signal frequencies. As such, circuits and devices that are used to process or otherwise handle variable frequency or wide bandwidth signals may have corresponding frequency-dependent gains. Accordingly, the frequency-dependent gain for a particular circuit or device can be plotted in decibels over a range of frequencies. The resulting graph is referred to herein as a "frequency-dependent gain profile". FIG. 3 illustrates an example frequency-dependent gain profile.

Frequency-Dependent Gain and Frequency-Dependent Gain Profiles

As shown in FIG. 3, the frequency-dependent gain profile 300 is measured over some range of frequencies and has a range of gain values 315 (e.g., L dB) ranging from a minimum gain value 305 to the maximum gain value 310. The particular example frequency-dependent gain profile 300 illustrates a drop-off in gain as a function of frequency. This characteristic of a frequency-dependent gain profile is referred to herein as the "negative gain slope". While it is possible for the frequency-dependent gain profile to be linear, the example shown in FIG. 3 illustrates how the negative gain slope of the frequency-dependent gain represented by the frequency-dependent gain profile 300 of a particular circuit or device may be nonlinear. The nonlinearity of the frequency-dependent gain may be represented by one or more curves in the frequency-dependent gain profile. In the example shown in FIG. 3, the nonlinearity of the frequency-dependent gain is illustrated as a slight downward curve in the frequency-dependent gain profile 300.

Figure 4:
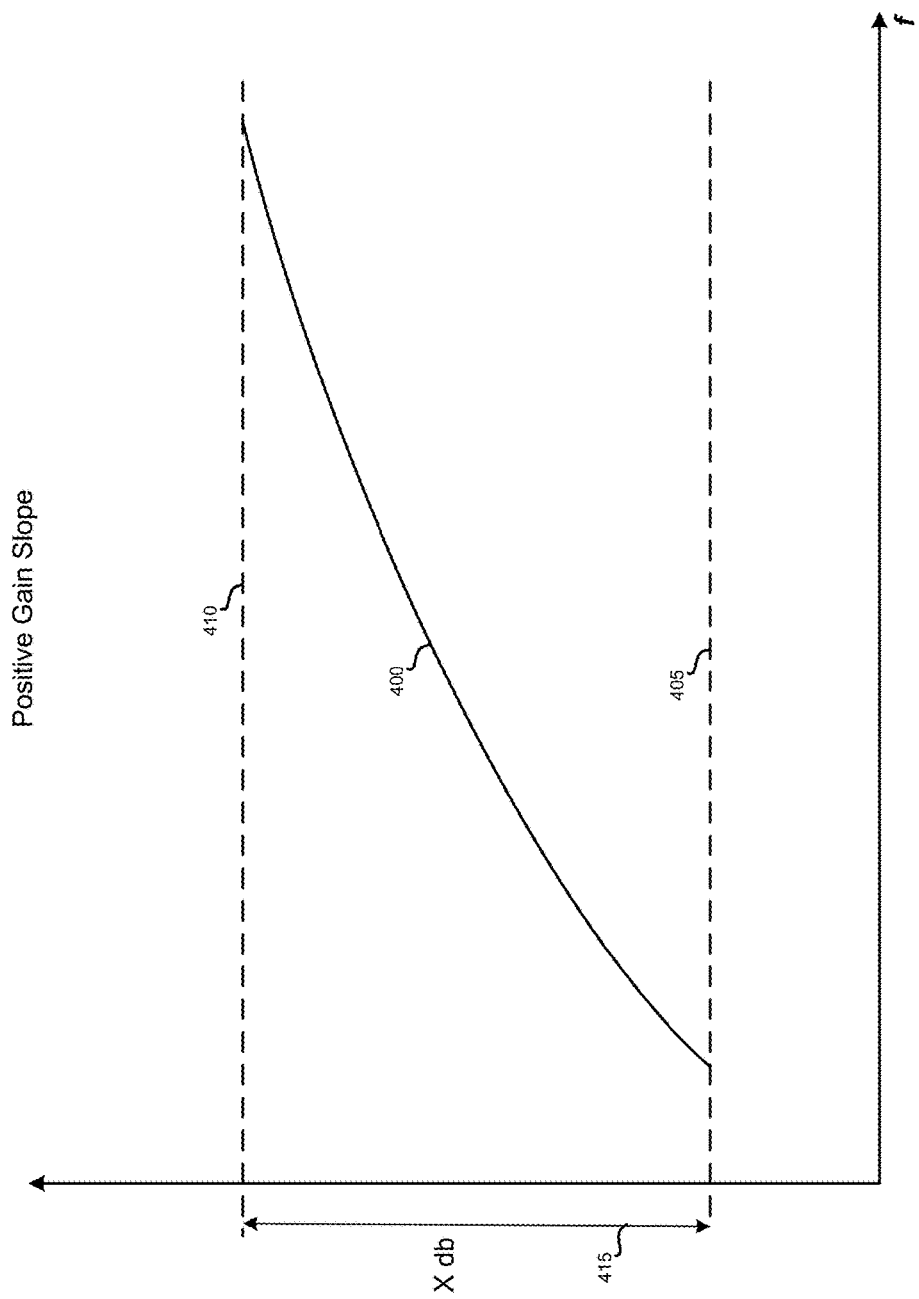
FIG. 4 is an example graph of a frequency-dependent gain profile with positive gain slope.

FIG. 4 illustrates a frequency-dependent gain profile 400 of another particular circuit or device with a "positive gain slope". In this example, the gain increases from the minimum gain 405 to the maximum gain 410 as the frequency increases. Not only is the sign of the gain slope of frequency-dependent gain profile 400 the opposite of the sign of the gain slope of the frequency-dependent gain profile 300, the range of gain 415 (X db), given that the scale of the gain axes are the same, is smaller than the range of gain 315 (L db), such that L>X. Frequency-dependent gain profiles having gain slope with smaller ranges of gains and/or smaller slopes are referred to herein as having "flatter gain slope" than frequency-dependent gain profiles having gain slopes with larger ranges of gain and/or steeper slopes. Accordingly, frequency-dependent gain profile 400 may be considered flatter than the frequency-dependent gain profile 300.

The nonlinearity of the frequency-dependent gain may be represented by one or more curves in the frequency-dependent gain profile. Frequency-dependent gain profiles 300 and 400 are monotonic and each includes a single curve. However, it is possible for circuits and devices to have nonlinear frequency-dependent gains that can be represented by frequency-dependent gain profiles that are non-monotonic and have both positive and negative slopes. For example, some frequency-dependent gain profiles can be approximated by higher order polynomials. When a frequency-dependent gain profile is non-monotonic over some region of the frequency band, the frequency-dependent gain is said to have "gain ripple". The smaller the amplitude of the gain ripples, the flatter the frequency-dependent gain profile is considered. Accordingly, a frequency-dependent gain profile with shallow slope and low amplitude ripple is said to be flatter than a frequency-dependent gain profile with a steep slope and a higher amplitude ripple.

In many instances, a flat frequency-dependent gain is desirable. In particular, in wireless communication systems, because every component frequency of a given signal is amplified or attenuated according to the frequency-dependent gain of a particular circuit or device, circuits or devices with larger ranges of gain may suffer from various limitations. In particular, when transmitting electromagnetic signals over wide bandwidths, systems with significant gain slope or high amplitude gain ripple may cause some portions of the signal transmitted or received with a given power to be clipped or lost in the noise. To counteract this effect, the entire system may be operated with higher dynamically ranges. The drawback to operating the communication system with higher dynamic ranges is an increase in power consumption. According to various embodiments of the present disclosure, to avoid operating a given transceiver with unnecessary dynamic range, the frequency-dependent gain of a given system can be compensated by using one or more variable frequency-dependent gain compensation circuits. In the interest of clarity and brevity variable frequency-dependent gain compensation circuits are also referred to herein as "variable equalizers".

Variable Frequency-Dependent Gain Compensation Circuits and Equalizers

Figure 5:
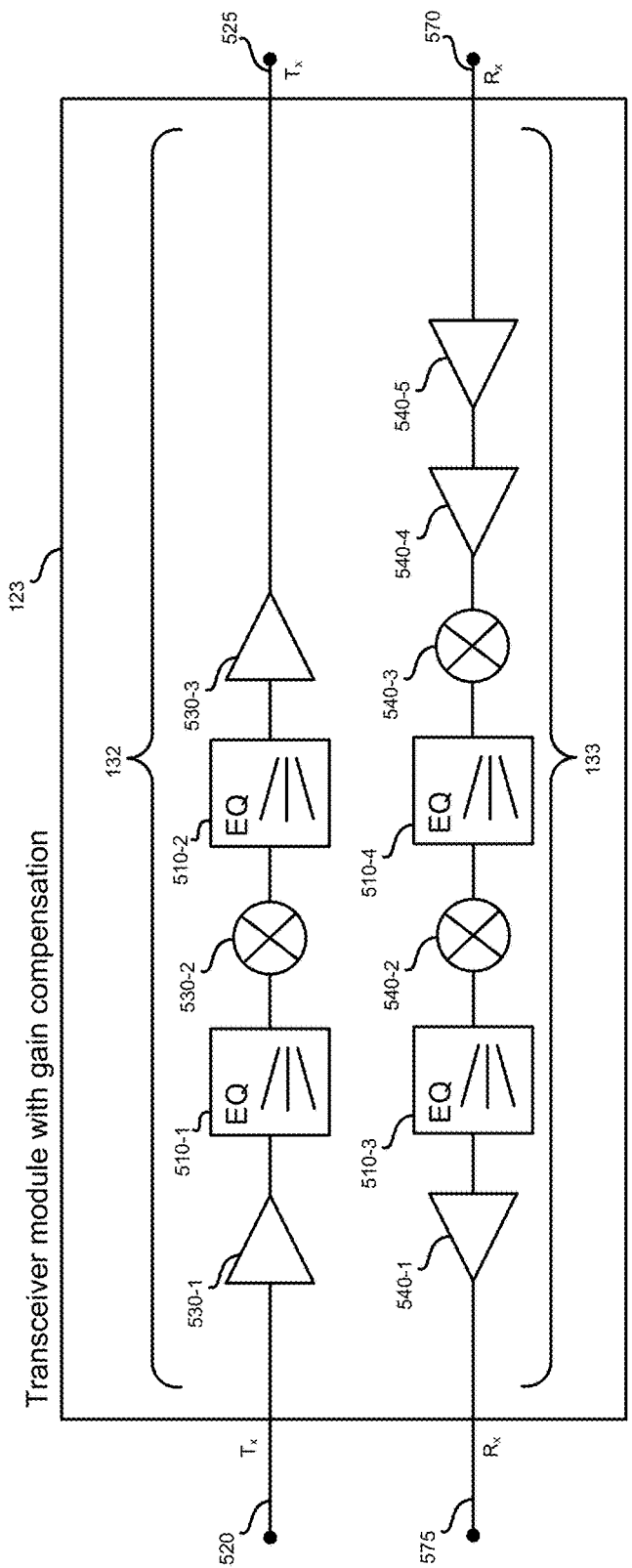
FIG. 5 is a schematic of a transceiver module with gain compensation according to various embodiments of the present disclosure.

FIG. 5 illustrates an embodiment of the present invention in which multiple variable equalizers 510 can be included in the transmission and receive paths 132 and 133 of transceiver circuit module 123. As shown, the transmission path 132 from transmission input 520 to transmission output 525 can be equalized separately from the receive path 133 from receive input 570 to receive output 575. In the particular example shown, the transmission path 132 includes a number of signal processing components 530 coupled to the input terminals and the output terminals of the variable equalizers 510. The signal processing components 530 may include a number of amplifiers, signal frequency converters and/or mixers. Similarly, the receive path 133 can include a number of signal processing components 540. The receive signal processing components 540 can include a number of amplifiers, signal frequency converters, and/or mixers. While not shown, the transceiver circuit module 123 can also include a control circuit to establish control signals to control the variable equalizers 510. In such embodiments, the control circuit can establish control signals in response to stored predetermined settings or signals received from an external source.

Variable equalizers 510 can be coupled to one or more of the various signal processing components 530 and 540. While one particular example configuration of circuitry of the transceiver module 123 according to one embodiment is shown in FIG. 5, one of ordinary skill in the art will recognize other configurations of signal processing components 530 and 540 and variable equalizers 510 are possible without departing from the spirit or scope of the present disclosure. In one embodiment, the variable equalizers 510 may be substantially the same as the other variable equalizers 510. Accordingly, the design of the components and circuitry of variable equalizers 510 may be substantially similar, if not identical, such that the level and type of variable frequency-dependent gains that each variable equalizer 510 can establish will be substantially similar, if not identical.

In other embodiments, the variable equalizers 510 can each have a different design and/or configuration of internal circuitry and components, such that the level and type of variable frequency-dependent gains established by each of the variable equalizers 510 will be different. Embodiments in which the equalizers 510 are the same and different are associated with various advantages and drawbacks. For example, in embodiments which the equalizers 510 are the same the complexity of setting each of the variable equalizers 510 may be reduced given that only fixed number of potential gain compensation profiles may be achieved. In contrast, in other embodiments in which the equalizers 510 are different or varied, the gain compensation that can be achieved can be more customized to a greater degree according to the frequency-dependent gain profile of the circuits or devices to which the equalizers 510 or coupled.

Figure 6:
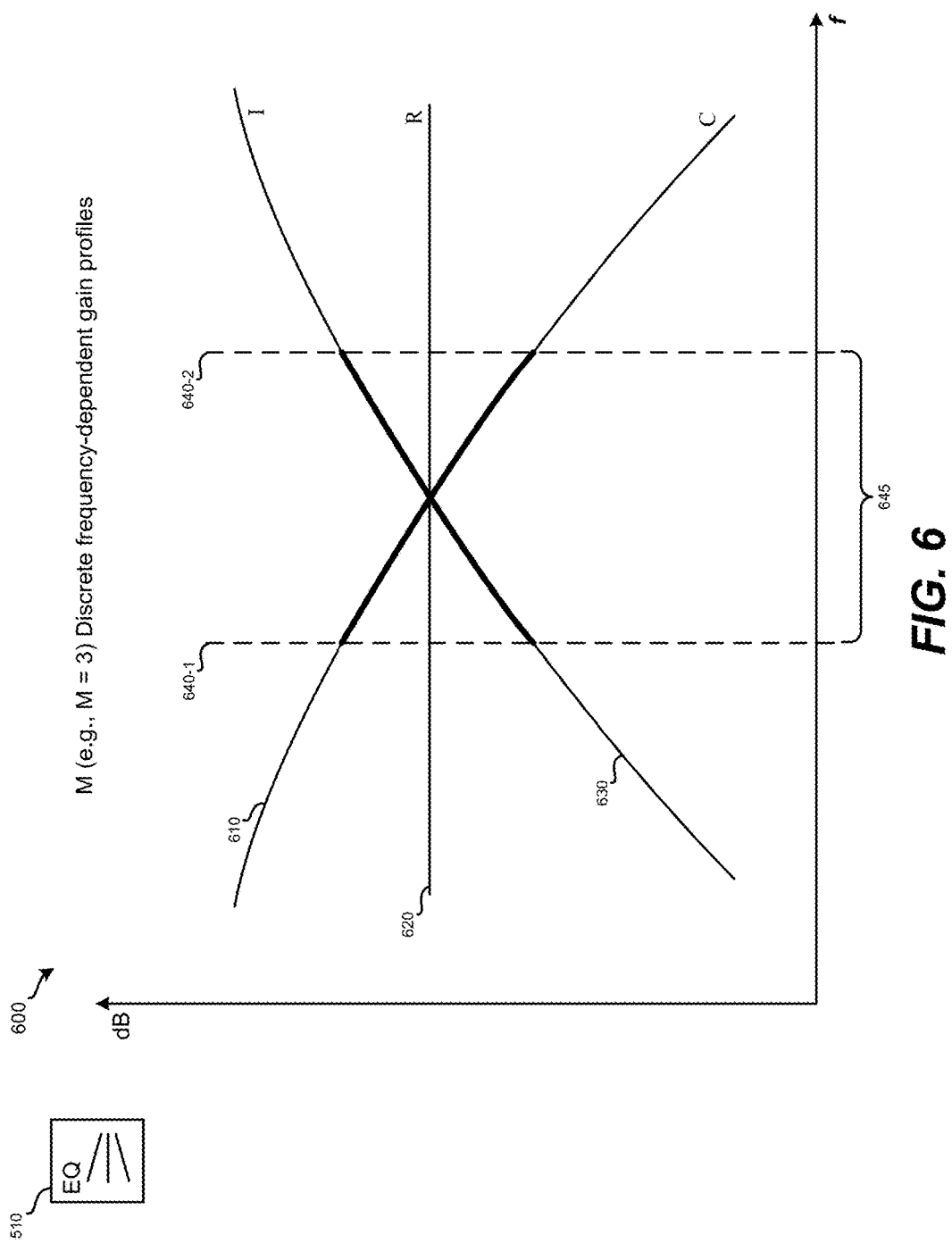
FIG. 6 is an example graph of variable frequency-dependent gain compensation that can be established by various embodiments of the present disclosure.

FIG. 6 illustrates a graph 600 of M discrete frequency-dependent gain profiles corresponding to the M discrete possible frequency-dependent gains possible with M settings of a particular equalizer 510, in accordance with embodiments of the present disclosure. In one embodiment, particular variable equalizers 510 may be configurable to establish some fixed number of discrete frequency-dependent gains. In the example shown in FIG. 6, the variable equalizer 510 may be set to establish M, wherein M=3, frequency-dependent gains corresponding to frequency-dependent gain profiles 610, 620, and 630. Frequency-dependent gain profile 610 indicates that the corresponding frequency-dependent gain of the variable equalizer 510 is set to include a negative gain slope. Frequency-dependent gain profile 620 indicates that the corresponding frequency-dependent gain of the variable equalizer 510 is set to be flat across all frequencies (i.e., no gain slope or ripple). Finally, the frequency-dependent gain profile 630 indicates that the corresponding frequency-dependent gain of the variable equalizer 510 is set to include a positive gain slope.

Depending on the particular configuration and components of the variable equalizer 510, the available frequency-dependent gains may be substantially linear for various portions of the frequency spectrum. For example, as illustrated in FIG. 6, the frequency-dependent gain profiles 610, 620, and 630 are all substantially linear within range 645 between lower frequency 640-1 and upper frequency 640-2. Accordingly, the configuration and components of the variable equalizer 510 can be chosen so that the possible gains established are linear across a particular range 645 interest. Accordingly, the size and placement of range 645 may be adjusted up or down in order to better compensate for frequency-dependent gain slope and ripple due to other components of the transceiver module 123 or the TRIA 120, according to various embodiments of the present disclosure.

Variable Equalizers

Figure 7:
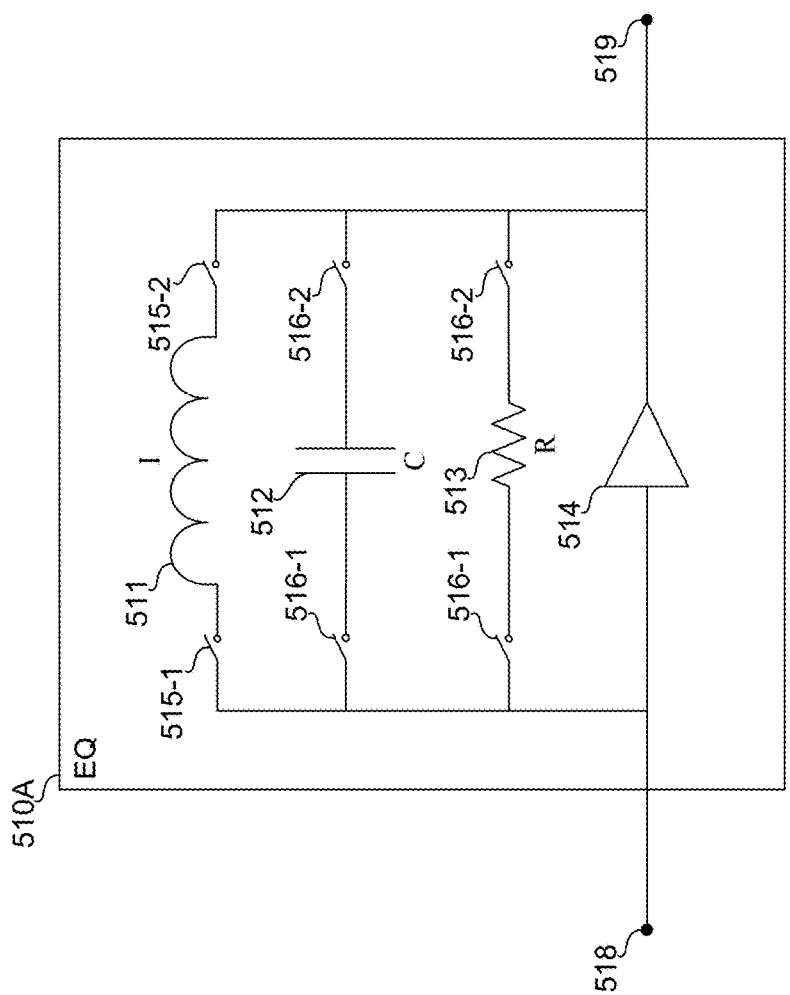
FIG. 7 is a schematic of a variable equalizer according to various embodiments of the present disclosure.

FIG. 7 illustrates an example variable equalizer 510A according to various embodiments of the present disclosure. As shown, the variable equalizer 510A can include an input terminal 518 and output terminal 519. An amplifier 514 can be coupled to the input terminal 518 and the output terminal 518. In one embodiment, a number of electronic components can be selectively coupled in parallel to the amplifier 114. In the example shown, conductor 511, capacitor 512, and/or resistor 513 may be coupled to the amplifier 514 in parallel selectively by switches 515, 516 and 517, respectively. Accordingly, the amplifier 514 may be provided feedback through any one or more of inductor 511, capacitor 512, and/or resistor 513 to establish frequency-dependent gain with positive, negative, or zero gain slope. The magnitude and sign of the slope can depend on the particular values chosen for each one of the components 511, 512, and 513 as well as the type of amplifier chosen for amplifier 514.

For example, when only the switches 515 are closed to couple the inductor 511 to the amplifier 540 in parallel, the frequency-dependent gain of the variable equalizer 510A will have a positive gain slope. This is illustrated in FIG. 6 by frequency-dependent gain profile 630. When only switches 516 are close to couple the capacitor 512 to the amplifier 514 in parallel, the frequency-dependent gain of the variable equalizer 510A will have a negative gain slope. This is illustrated in FIG. 6 by frequency-dependent gain profile 610. Additionally, when only switches 517 are closed to couple the resistor 513 to amplifier 514 in parallel, the frequency-dependent gain of the variable equalizer 510A will have zero gain slope, as illustrated by frequency-dependent gain slope profile 620 in FIG. 6. While the frequency-dependent gain profiles 610 and 630 are illustrated as being symmetrical about their intersection point with the frequency-dependent gain profile 620, in some embodiments the frequency-dependent gain profiles 610 and 630 are not symmetrical. Accordingly, in variable equalizers 510 that have some number M of possible asymmetrical frequency-dependent gains, the corresponding frequency-dependent gain profiles may intersect each other at multiple frequencies. For example, frequency-dependent gain profile 630 may be shifted up so that it intersects the frequency-dependent gain profile 620 at a frequency greater than the frequency at which frequency-dependent gain profiles 610 and 620 intersect.

As mentioned above, each set of switches 515, 516, and 517 can be operated independently to couple one or more of inductor 511, capacitor 512, and resistor 513 to the amplifier 514 alone or in combination with one another to establish a desired frequency-dependent gain. In one embodiment, the frequency-dependent gain of the variable equalizer 510 can be set to compensate for the frequency-dependent gain of other components to which the variable equalizer 510 is coupled. For example, if an amplifier 530-1, signal mixer/converter 530-2, and/or a combination thereof in transceiver module 123 shown in FIG. 5 result in significant negative gain slope, then equalizers 510-1 and/or 510-2 can be set to establish corresponding positive gain slope compensation (i.e., setting the switches 515 to couple the inductor 511 to the amplifier 514 in parallel). Because of the additive nature of frequency-dependent gain, the resulting frequency-dependent gain of the two devices when coupled to one another will be a frequency-dependent gain that includes the sum of the two corresponding individual frequency-dependent gains. Accordingly, when two devices with oppositely signed gain slope (e.g., one device having positive gain slope and one device having negative gain slope) are coupled to one another, the frequency-dependent gain of the two devices can be flatter than the frequency-dependent gain of either device independently.

Figure 8:
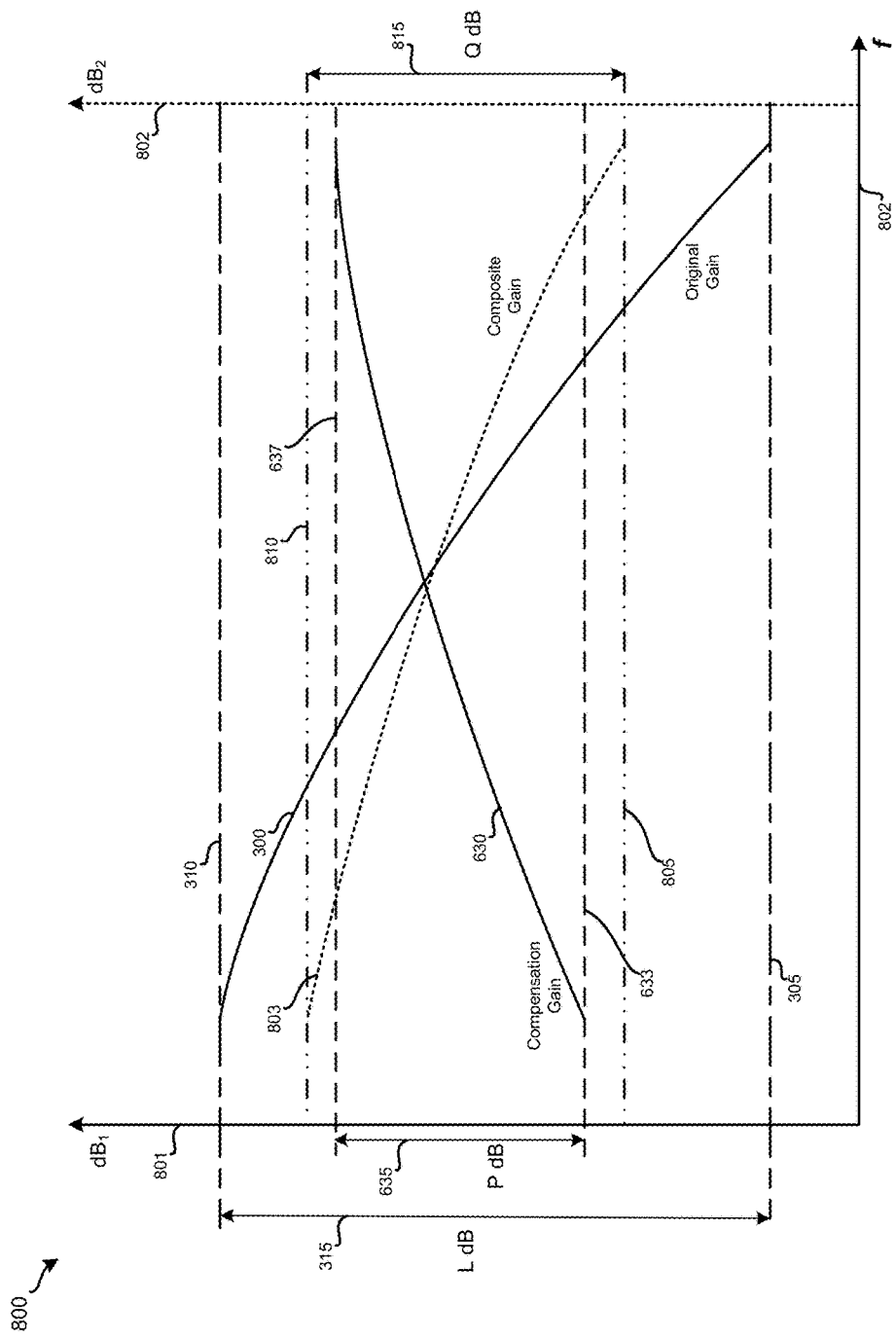
FIG. 8 is an example graph of variable frequency-dependent gain compensation that can be established by various embodiments of the present disclosure.

FIG. 8 is a graph 800 of one example scenario in which the frequency-dependent gain of a particular variable equalizer 510 can be set to compensate for the composite negative gain slope of the frequency-dependent gain profile 300 of a particular device or circuit to which it is coupled. In one scenario, the frequency-dependent gain profile 300 corresponds to the frequency-dependent gain of a particular device or circuit (e.g. the transceiver module 123) illustrated in FIG. 3. In some embodiments, to correctly set the compensating frequency-dependent gain of the variable equalizer 510, it is necessary to first measure the frequency-dependent gain of the circuit or device that needs to be compensated.

The frequency-dependent gain profile 300 can be determined by measuring the gain 801 response to signals in the frequency spectrum 802. In one embodiment, the frequency-dependent gain profile 300 can be measured manually by a technician who passes signals at various frequencies through the device. In other embodiments, the frequency-dependent gain profile 300 can be measured by a computer system more quickly by automatically passing signals at all frequencies through a device and measuring the gain. Manually or automatically measuring the gain of a particular circuit or device may include comparing the amplitude (e.g., power, voltage, current, etc.) of an input signal to the amplitude of the output signal. One of ordinary skill in the art will recognize there are many ways to measure and/or calculate gain of a circuit.

In various embodiments, gain is a measure of the ability of a circuit to increase the power or amplitude of a signal from the input to the output, by adding energy to the signal from some power source. Gain can be defined as the mean ratio of the signal output of a circuit or device to the signal input of the same circuit or device. Gain is often expressed using logarithmic decibel (dB) units. A gain greater than 1 (i.e., >0 dB) is indicative of amplification. Amplification is typically achieved using an active component or circuit. In contrast most passive circuits will have a gain less than 1. In various embodiments of the present disclosure, the term gain refers to power gain.

The power gain may be calculated according to the following equation (where P_out is the power of the output signal and P_in is the power of the input signal):

In decimal logarithm notation:

$$\text{Gain}=10 \log(P\_out/P\_in) \text{ dB};$$

Gain can also be calculated using natural logarithm notation:

$$\text{Gain}=\ln(P\_out/P\_in) \text{ Np}$$

with result in units known as nepers (Np) instead of decibels (dB).

In embodiments of the present disclosure, any calculation of power, voltage, or current gain can be used without departing from the spirit or scope of the invention. Once the gain values for signals spanning some portion of the frequency spectrum are determined for a particular circuit or device, the gain values can be plotted as a function of frequency to generate a corresponding frequency-dependent gain profile. In the example shown, the frequency-dependent gain profile 300 indicates that the circuit or device includes gain values ranging from an upper limit at 310 and a lower limit at 305 corresponding to a range of gain values of L dB 315. The range of L dB 315 may be too wide to allow the circuit or device to effectively process signals without having to increase the dynamic range with which the circuit or device is operated. For example, signals in the lower end of the frequency spectrum 802 may be amplified to the point that the modulated signal is clipped by the upper limit of the dynamic range. On the opposite end of the frequency-dependent gain profile 300, signals in the upper end of the frequency spectrum 802 may be attenuated to the point that they are lost in the noise of the circuit or device. Various embodiments of the present disclosure advantageously provide for the variable compensation of systematic frequency-dependent gain to allow various circuits and devices to operate with improved power consumption characteristics and signal-to-noise ratio performance by reducing the range of gain in the associated frequency-dependent gain profile.

Establishing Frequency-Dependent Gain Compensation

FIG. 8 illustrates the ability of a variable equalizer 510 to reduce the range of frequency-dependent gain of a given device or circuit. In the particular example shown, the original frequency-dependent gain of the device or circuit is illustrated by the aforementioned frequency-dependent gain profile 300. Since the frequency-dependent gain profile 300 has significant negative gain slope, the variable equalizer 510 can be set to establish a frequency-dependent gain with some level of positive gain slope. In particular, the frequency-dependent gain of the variable equalizer 510 may be represented by the frequency-dependent gain profile 630. The gain profile 630 includes gain values ranging from 633 to 637 spanning a range of P dB 635. As illustrated, P is less than L. Accordingly, when the variable equalizer 510 is coupled to the particular device or circuit, the corresponding frequency-dependent gains are additive. The resulting frequency-dependent gain is the composite of the frequency-dependent gains of the device or circuit and the variable equalizer 510, represented in FIG. 8 as the composite frequency-dependent gain profile 803.

While the composite frequency-dependent gain profile 803 is not perfectly flat and includes negative gain slope with gain values ranging from levels indicated by references 805 to 810, the range 815 of gain values is improved over the uncompensated frequency-dependent gain profile 800. Some embodiments of the present invention are directed toward flattening the frequency-dependent gain of a given device or circuit, and not necessarily achieving zero gain slope or ripple. For example, establishing frequency-dependent gain with gain values ranges from approximately 2 dB to 10 dB may be sufficient for transmitting and receiving microwave and radio frequency electronic signals for satellite and terrestrial point-to-point communication with improved power consumption characteristics.

Adjusting various types of electronic devices, such as TRIA 120, to have sufficiently flat frequency-dependent gain has traditionally been accomplished by manually adjusting the frequency-dependent gain of individual circuits and components. Essentially, a technician would manually determine and calculate the frequency-dependent gain of the device as a whole or on the component circuit level. Given a particular frequency-dependent gain profile with various degrees of gain slope and/or ripple, the technician would begin adding components in an attempt to flatten out the frequency-dependent gain profile. However, because adding compensation circuitry to one component usually causes the frequency-dependent gain of another component to change, the technician would need to iteratively check and adjust the frequency-dependent gain of each component and the device as a whole. In large scale devices with many components that can contribute to the frequency-dependent gain of the device, manually finding and attempting to compensate for sources of significant gain slope and ripple can be an arduous and time consuming endeavor. Embodiments of the present invention allow for improved devices, systems, and methods for fast and cost effective frequency-dependent gain compensation in various wide bandwidth systems. Such embodiments are advantageous in large-scale production when even small delays in completing the assembly of individual units can aggregate into significant delays in completing a quantity of units.

Figure 9:
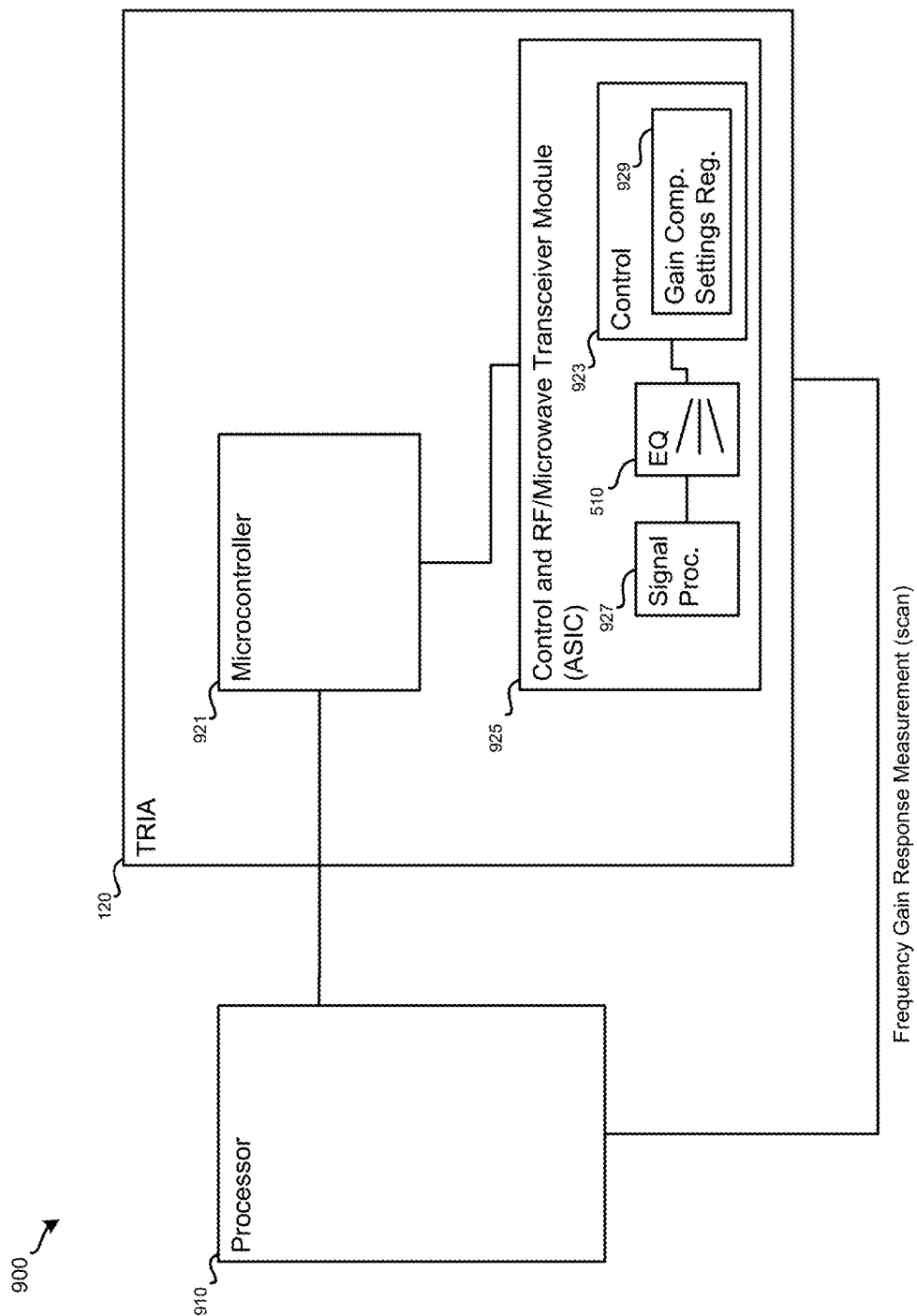
FIG. 9 is a schematic of a system for establishing variable frequency-dependent gain using a variable equalizer according to various embodiments of the present disclosure.

FIG. 9 illustrates an example system 900 for establishing variable frequency-dependent gain compensation using a variable equalizer 510, according to embodiments of the present disclosure. In one embodiment, the system 900 may include a device, such as TRIA 120, configured with one or more variable equalizers 510. The TRIA 120 may also include a number of other components, such as signal processing circuits or devices. The TRIA 120 may include a microcontroller 921 and the signal processing circuits may be a radio frequency/microwave transceiver module ASIC 925, also referred to herein as the transceiver module 925. The microcontroller 921 may be coupled to the transceiver module 925 to send signals to its various components. Accordingly, the signal processor 927, the variable equalizer 510, and/or the control circuit can include input terminals for receiving signals from the microcontroller or other external source.

The transceiver module 925 may incorporate functionality for establishing transmission paths and receive paths for bidirectional communication between a computing device in one location and a network service via an access point in another location. In some embodiments, the transceiver module 925 may be implemented as a monolithic integrated circuit device, or MMIC.

The transceiver module 925 may include one or more signal processing circuits 927. Signal processing circuits 927 may process a signal to amplify, attenuate, convert the frequency, or otherwise modify the signal. The transceiver module 925 may also include a control circuit 923. The control circuit 923 may receive signals on an input terminal from an external source, such as the microcontroller 921, or access predetermined settings stored in a memory or register. The control circuit 923 may then establish control signals in response to the signals received from the external source or the predetermined. In the particular example shown, the predetermined gain compensation settings can be stored in the control circuit 923 in register 929. While the register 929 is illustrated as being part of the control circuit 923, one of ordinary skill in the art will recognize that the gain compensation settings may also be stored elsewhere in the system 900. For example, the gain compensation settings can be stored in memory separate from the control circuit 923, and provided to the control circuit 923 on its input terminal as signals by the microcontroller 921.

In one embodiment, one or more variable equalizers 510 and one or more control circuit 923 can be implemented in a unitary integrated circuit (IC) for establishing frequency-dependent gain. As such, in one embodiment, a variable equalizer 510 can be implemented in an IC that includes a corresponding control circuit 923. In some embodiments, the control circuits 923 of the IC can be used to control the multiple variable equalizers 510 according to signals received on one or more input terminals of the control circuit 923 or the IC. In some embodiment, the control circuits 923 of the IC can control multiple variable equalizers 510 of the IC according to predetermined gain compensation settings stored in register 929.

While the signal processing circuit 927 is illustrated having only a single path, one of ordinary skill in the art will recognize that signal processing circuit 927 may include multiple paths processing signals. For example, one path (e.g., a transmit path) may include one or more variable equalizers 510 and one or more control circuits 923, while another path (e.g., a receive path) may include one or more other variable equalizers 510 and one or more other control circuits 923.

In one embodiment, the TRIA 120 may operate independently according to computer readable code including instructions for operating microcontroller 921 and/or the transceiver module 125 to transmit and receive electromagnetic signals to facilitate communication between an indoor unit 110 and a remote device. In other embodiments, the TRIA 120 may be operated by the processor 910 in an external computing device (e.g., a desktop computer, a dedicated testing device, or a portable computing device, etc.). To determine the gain compensation settings for variable equalizer 510 to establish the best type and level of gain compensation, the processor 910 can send control signals to the microcontroller 921 according to computer readable code that includes instructions for running a test routine to establish or characterize the frequency-dependent gain of the transceiver module 925 and/or the TRIA 120 as a whole. For example, the processor 910 can send signals to the microcontroller 921 to generate and/or send test signals at various frequencies through the components of the TRIA 120 including, but not limited to, the transceiver module 925. In addition, the processor 910 can be coupled to the output of the TRIA 120 and/or the outputs of the transceiver module 925, through one or more intermediate circuits or devices, to measure and/or calculate the respective frequency-dependent gains of the TRIA 120 and/or transceiver module 925. Based on the determined frequency-dependent gain and the available levels and type of frequency-dependent gain compensation that the variable equalizer 510 can establish, the processor 910 can determine the settings for the variable equalizer 510 to establish a composite frequency-dependent gain to be within a target range of gain values (e.g., within a range of 2 dB).

In one embodiment, the variable equalizer 510 can be designed and manufactured in one of variety of configurations to establish different types and different degrees of variable frequency-dependent gain. Accordingly, a variable equalizer 510 can be selected based on the type and degree of frequency-dependent gain of the circuit or device to which it will be coupled.

In one embodiment, the configuration of the variable equalizer 510 may provide for establishing positive and/or negative gain slope compensation. In addition, the configuration of the variable equalizer 510 may provide for establishing gain slope of various degrees. For example, the variable equalizer 510 can include selectable components for establishing positive or negative gain slopes (e.g., −1, −2, +1, and +2, or any other values of gain slope) that may be useful for compensating for the frequency-dependent gain slope of a particular signal processing circuit or device. For example, if the determined frequency-dependent gain of the TRIA 120 or the transceiver module 925 is determined to include typical gain slope of approximately ±2, then a particular variety of variable equalizer 510 that can establish a gain slope of ±2 can be chosen to be included in the TRIA 120. In one embodiment, the gain slope values are determined by inductance values and capacitance values selected for the inductors, capacitors, and resistors in the variable equalizer 510.

In another embodiment, the variable configuration of the variable equalizer 510 may provide for establishing higher order frequency-dependent gain compensation types, such as ripple. For example, a variable equalizer can be configured to establish gain ripple of various shapes and amplitudes. The amplitude, period, and frequency locations of the zero slopes in the gain ripple can be variable. Other variable equalizers can be configured to establish frequency-dependent gain compensation profiles that include positive and/or negative gain slope with varying magnitudes of slope and gain ripple of various shapes and amplitudes.

In one embodiment, the variable equalizer 510 can include selectable circuits and/or components for establishing various patterns and amplitudes of ripple-type frequency-dependent gain compensation. In addition, the variable equalizer 510 may include settings for shifting the frequency-dependent gain up or down the frequency spectrum so that the frequency-dependent gain profiles of the circuit or device of interest and the variable equalizer 510 intersect in a frequency range of interest. In one embodiment, the variable equalizer 510 may include amplifiers, resistors, and/or active gain compensation circuits that can be selected by corresponding switches to shift the corresponding frequency-dependent gain along the frequency spectrum or boost the overall gain.

In various embodiments, the configuration settings of the variable equalizer 510 can be set by signals from an external source, such as the microcontroller 921, processor 910, and the like. Once the settings for the variable equalizer 510 that establish appropriate frequency-dependent gain compensation is determined, the settings can be stored to a memory or register. Thus, when the TRIA 120 or the transceiver module 925 is activated, the control circuit 923 can configure the variable equalizer 510 according to the gain compensation settings. As shown, the gain compensation settings can be stored in a register 925 control circuit 923.

Figure 10:
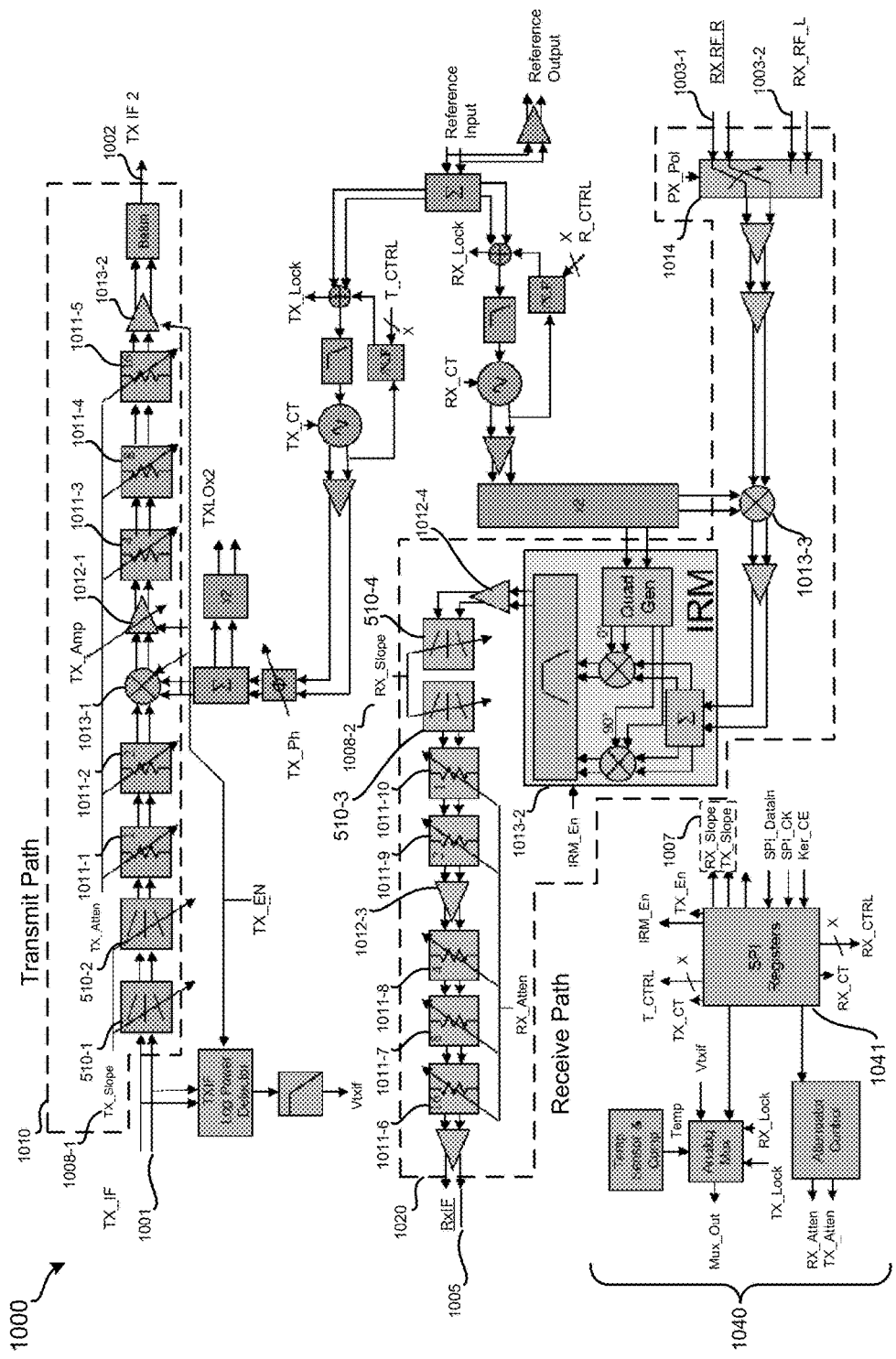
FIG. 10 is a schematic of a signal processing device with variable frequency-dependent gain compensation according to various embodiments of the present disclosure.

FIG. 10 is a schematic diagram of an example circuit 1000 according to an embodiment of the present disclosure. Circuit 1000 can include functionality for a combined signal control and transceiver integrated circuit that incorporates one or more variable equalizer circuits 510 with signal processing circuits 1011, 1012, and 1013 and control circuit 1040. The circuit 1000 can be used in various bi-directional communication systems. Accordingly, the circuit 1000 can include a transmit path 1010 and a receive path 1020 for processing transmission signals from a local device or system and signal received from a remote source. As previously discussed herein, such embodiments can be implemented in and improve various point-to-point terrestrial communication systems (e.g., microwave band data links and Internet access) and satellite-based communications (e.g., bent pipe Internet access).

In one embodiment, the transmission path 1010 can include an input terminal 1001 and an output terminal 1002, as well as multiple variable equalizers 510, multiple variable attenuators 1011, one or more amplifiers 1012 and/or signal mixers 1013 coupled to one another. In the example shown, the variable equalizers 510 are disposed at the beginning of the transmission path 1010 (i.e., near the input terminal), however the variable equalizers 510 may be located anywhere within the transmission path 1010 without deviating from the spirit or scope of the present disclosure.

In one embodiment, the receive path 1020 can include an input terminal 1003 and an output terminal 1005, as well as multiple variable equalizer's 510, multiple variable attenuators 1011, one or more amplifiers 1012 and/or signal mixers 1013 coupled to one another. The receive path 1020 can include circuitry for receiving both right-handed and left-handed polarized RF receive signals. In one embodiment, the receive path 1020 includes a single path that can be shared with signals of multiple polarization using a receive polarization switch 1014.

In an embodiment, the frequency-dependent gain of the variable equalizers 510 can be set using the predetermined gain compensation settings 1007 stored in the register 1041 of the control circuit 1040. The predetermined setting 1007 can be determined by various methodology described herein. In another embodiment, the frequency-dependent gain of the variable equalizers 510 can be set by an external source, such as a microcontroller or microprocessor (not shown). In either embodiment, the frequency-dependent gain of the variable equalizers 510 can be set by control signals 1008 routed to the variable equalizer 510. (e.g., Rx_Slope 1008-1 and Tx_Slope 1008-2). The control signals 1008 can be provided to the variable equalizers 510 by the control circuit 1040 based on the settings in the register 1041 or signals received from the external source.

Embodiments in which the register 1041 sends the control signals 1008 are useful in scenarios in which the type and degree of necessary frequency-dependent gain compensation for the circuit 1000, and/or attached devices, has already been determined. Thus, when circuit 1000 is activated, the frequency-dependent gain of the variable equalizers 510 will be set according the predetermined gain compensation settings 1007 to establish the desired or acceptable level of gain slope or ripple for the circuit 1000.

Embodiments in which the control circuit 1040 establishes control signals 1008 in response to an external source are useful for determining the settings for the required or desired types and levels of frequency-dependent gain for each variable equalizer 510. In such embodiments, an external source, such as a testing or characterization computer system can feed test signals of various frequencies across the available frequency spectrum into the circuit 1000, and/or the devices to which it is coupled, and measure the frequency-dependent gain. The external source can then send signals that the control circuit can use to establish control signals 1008 that iteratively change the settings of the variable equalizers 510, and measure the composite frequency-dependent gain of the circuit 1000 with the various settings. The external source can then automatically choose or recommend the best possible settings for the variable equalizers 510 based on the various composite frequency-dependent gains and a set of target gain characteristics for the desired or tolerable composite frequency-dependent gain. In one embodiment, the external source can try every possible setting combination of the variable equalizers 510, compare the corresponding composite frequency-dependent gains, and then determine the optimal or most desirable variable equalizer setting combination based on the comparison. The settings can then be stored in the register 1041. While testing all possible variable equalizer setting combination may take some finite amount of time, it can lead to the best result because all possible composite frequency-dependent gain profiles can be evaluated relative to the target gain characteristics.

However, in high-volume production, even marginal amounts of time per unit can compound into significant aggregate delays. Adding even an extra second of time per unit in a one million unit order can cause a delay of more than 11 days. Accordingly, in some embodiments, to save time, the external source may be set to try one particular set of setting for the variable equalizers 510 and determine the corresponding frequency-dependent gain. For example, a manufacturer may determine that most devices with the circuit 1000 require +2 gain slope compensation, so the external source can begin with sending signals to the control circuit to set the variable equalizers 510 to establish a +2 gain slope. To ensure that the frequency-dependent gain of the particular circuit 1000, or the device to which circuit 1000 is coupled, is best improved by the +2 gain slope compensation, the external source can then bracket the initial settings to some predetermined number of settings that result in frequency-dependent gain above and below that established by the initial settings. For example, in addition to measuring the frequency-dependent gain at settings that establish +2 gain slope, the external source can also measure the frequency-dependent gain for settings that establish +1 and +3 gain slope. From the limited selection of settings, the external source can then determine which of the three possible composite frequency-dependent gains is the best and store the corresponding settings in the register 1041. Depending on the number of possible settings for variable equalizers 510 and the number units to be tested/characterized, the time savings afforded by testing the circuit 1000 with a limited number of settings can be significant when compared to testing the circuit 1000 with all possible settings.

Figure 11:
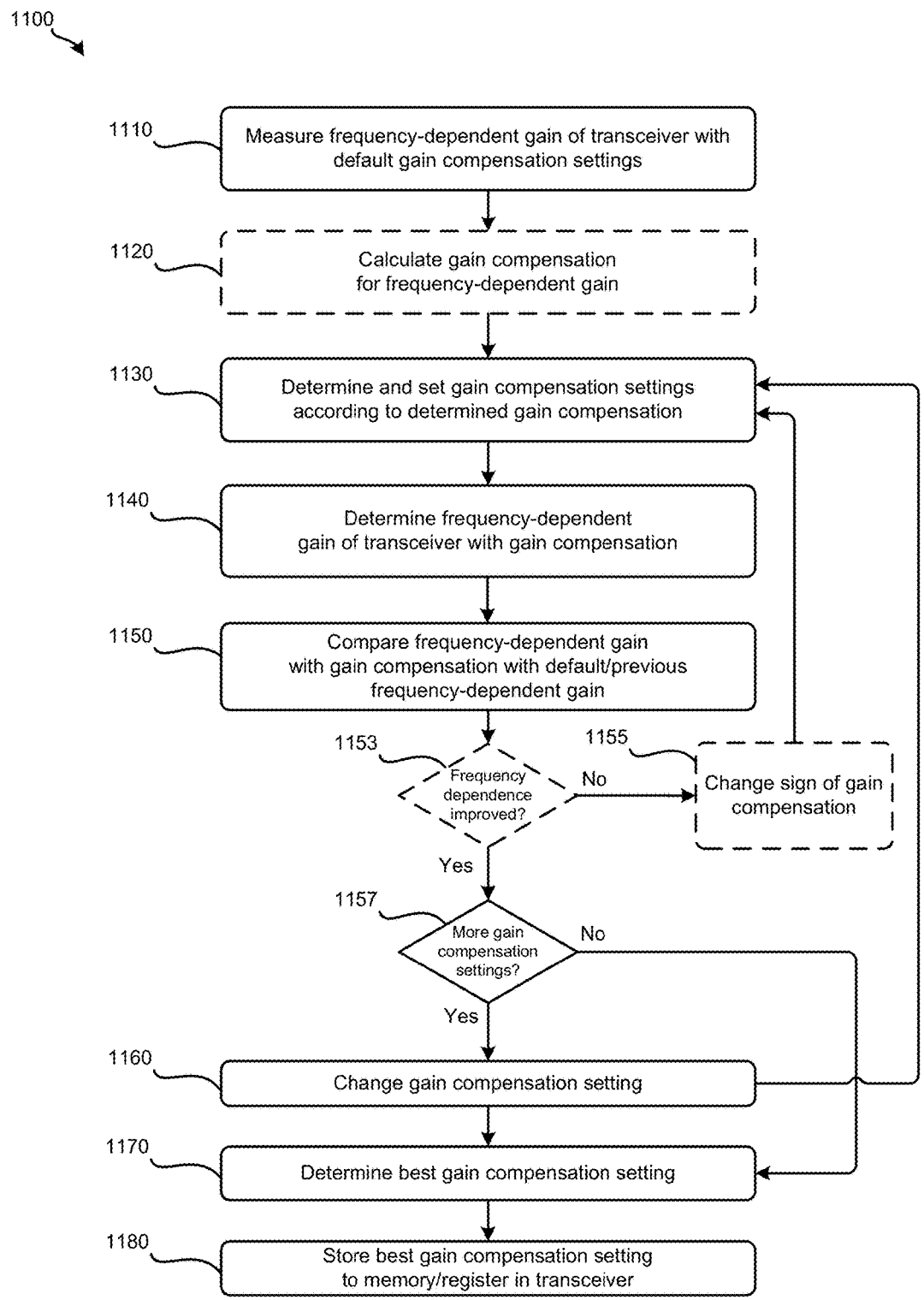
FIG. 11 is a flowchart of a method according to one embodiment of the present disclosure.

FIG. 11 is a flowchart of a method 1100 for determining the gain compensation settings of a variable equalizer 510 to establish frequency-dependent gain compensation for a system or device to which it is coupled. The frequency-dependent gain compensation can be based on a set of target characteristics for the desired or tolerable composite frequency-dependent gain. For example, the target characteristics can include definitions of the desired flatness of the composite frequency-dependent gain in the transmit path and/or the receive path. Such definitions can include specifications for the maximum range of gains values for the composite frequency-dependent gain profile and/or maximum magnitudes of gain slope. While the flowchart in FIG. 11 references measuring the frequency-dependent gain of a transceiver, one of ordinary skill in the art will recognize that the method can be used to determine the settings for one or more variable equalizers 510 to establish frequency-dependent gain compensation in any type of device or circuit with any number of signal paths.

In one embodiment, the method can begin at action 1110 in which a computing device measures the initial frequency-dependent gain of one or more signal paths in a transceiver with a set of initial gain compensation settings. In one embodiment, the initial gain compensation settings can refer to the default settings of a particular variable equalizer 510. The default gain compensation settings in some variable equalizers 510 can establish no gain at all. (i.e., a frequency independent bypass). However, the default settings for other variable equalizers 510 can establish a base level of frequency-dependent gain that includes some level of gain slope or ripple. The default settings for yet other variable equalizers 510 can establish a base level of gain independent of frequency (i.e., zero gain slope or ripple). Measuring the initial frequency-dependent gain of the transceiver can include sending signals with known signal levels at various frequencies spanning a particular frequency band through the transceiver and measuring the signal levels of the output signals. The gain for each frequency can then be calculated by comparing the signal levels of the input signals against the signal levels of the output signals. As described herein, the gains can be calculated and described in units of decibels or nepers. In one embodiment, the gain for each frequency can then be plotted to generate a frequency-dependent gain profile for the composite frequency-dependent gain of the transceiver and/or the variable equalizer 510. For example, the gain can be plotted as a decibels vs frequency.

Once the frequency-dependent gain of the transceiver and the variable equalizer 510 with the initial gain compensation settings is known, the computing device can determine gain compensation that would most likely adjust the frequency-dependent gain of the transceiver toward the target characteristics, in action 1120. In one embodiment, determining the gain compensation can include analyzing the frequency-dependent gain profile of the transceiver to calculate how much the profile needs to be flattened. In another embodiment, determining initial gain compensation can include analyzing the frequency-dependent gain profile of the transceiver to calculate where there are ripples in the gain profile. Based on the analysis of the frequency-dependent gain profile of the transceiver and/or the variable equalizer 510, the computing device can determine and set the gain compensation settings for the variable equalizer 510, in action 1130.

In some embodiments, determining the gain compensation settings can include referencing specifications for one or more particular variable equalizers 510 to determine the possible levels of frequency-dependent gain compensation that the equalizers 510 can establish. Based on the specifications for the particular variable equalizers 510, the computing device can determine the corresponding settings necessary to establish one or more of the possible levels of frequency-dependent gain compensation. Once the settings are determined, the computing device, either directly or through a microcontroller or control circuit, can set the gain compensation settings of the variable equalizers 510 according to the determined gain compensation settings.

In action 1140, the computing device can repeat the process for measuring the frequency-dependent gain of the transceiver and the variable equalize 510 configured according to the determined gain compensation settings. As described above, the computing device can send input signals of a known signal level at various frequencies through the transceiver and the variable equalizer 510, and compare the output signals with the input signals. In some embodiments, measuring the frequency-dependent gain of the transceiver with frequency-dependent gain compensation can include generating a frequency-dependent gain compensation profile.

In action 1150, the computing device can compare the compensated frequency-dependent gain with the frequency-dependent gain with the default gain compensation settings. Based on the comparison, the computing device can determine whether the frequency dependence of the gain has been improved in determination 1153. Determining whether the frequency-dependent of the gain has been improved may include analyzing the magnitude of the gain slope and/or the range of gains of the frequency-dependent gain profile. Accordingly, improvements in the frequency dependence of the gain profile may include determining a reduction in the range of gains (e.g., 10 dB to 5 dB) or a reduction in the magnitude of the gain slope. If no improvement is detected or if the frequency-dependence of the gain profile worsens (i.e., the magnitude of the gain slope or the range of gains increases), then the computing device can change the sign of the gain compensation, in action 1155. Changing the sign of the gain compensation can include referencing specifications for the variable equalizer 510 to determine the settings for establishing frequency-dependent gain that compensates in the opposite direction of the previously attempted gain compensation settings. For example, if the previously attempted settings for the variable equalizer establish a positive gain slope of a given magnitude, then changing the sign of the gain compensation may include selecting settings for the variable equalizer 510 that establish a positive gain slope of a smaller magnitude or a negative gain slope. Based on the change of sign of gain compensation, the computing device can reset the gain compensation settings based on the determined change in sign of gain compensation, in action 1130. At this point, actions 1130 through 1153 can be repeated to evaluate the efficacy of various gain compensation settings, until at determination 1153 the computing device determines that there has been an improvement in frequency-dependent gain.

In action 1157, the computing device can determine whether there are more gain compensation settings available for the variable equalizer 510. If there are more gain compensation settings available, then the computing device can change the gain compensation setting of the variable equalizer 510 to one of the remaining gain compensation settings, in action 1160. In action 1130, the computing device can then set the gain compensation settings according to the next gain compensation settings and repeat actions 1140 through 1157 until no additional gain compensation settings remain untested.

In action 1170, the computing device can then determine the best gain compensation settings by comparing the previously generated frequency-dependent gain profiles of the transceiver and variable equalizer 510 with the various gain compensation settings. In some embodiments, comparing the frequency-dependent gain profiles can include analyzing the magnitude of the gain slope and/or the range of the gains. In one embodiment, the computing device may determine that the best gain compensation settings as the settings that correspond to the frequency-dependent gain profile with the smallest gain range and/or the smallest magnitude of gain slope. In other embodiments, determining the best gain compensation settings may include identifying the settings that correspond to the frequency-dependent gain profile closest to the target characteristics.

In action 1180, the computing device can store the best gain compensation settings in a register or other memory in the transceiver.

Figure 12:
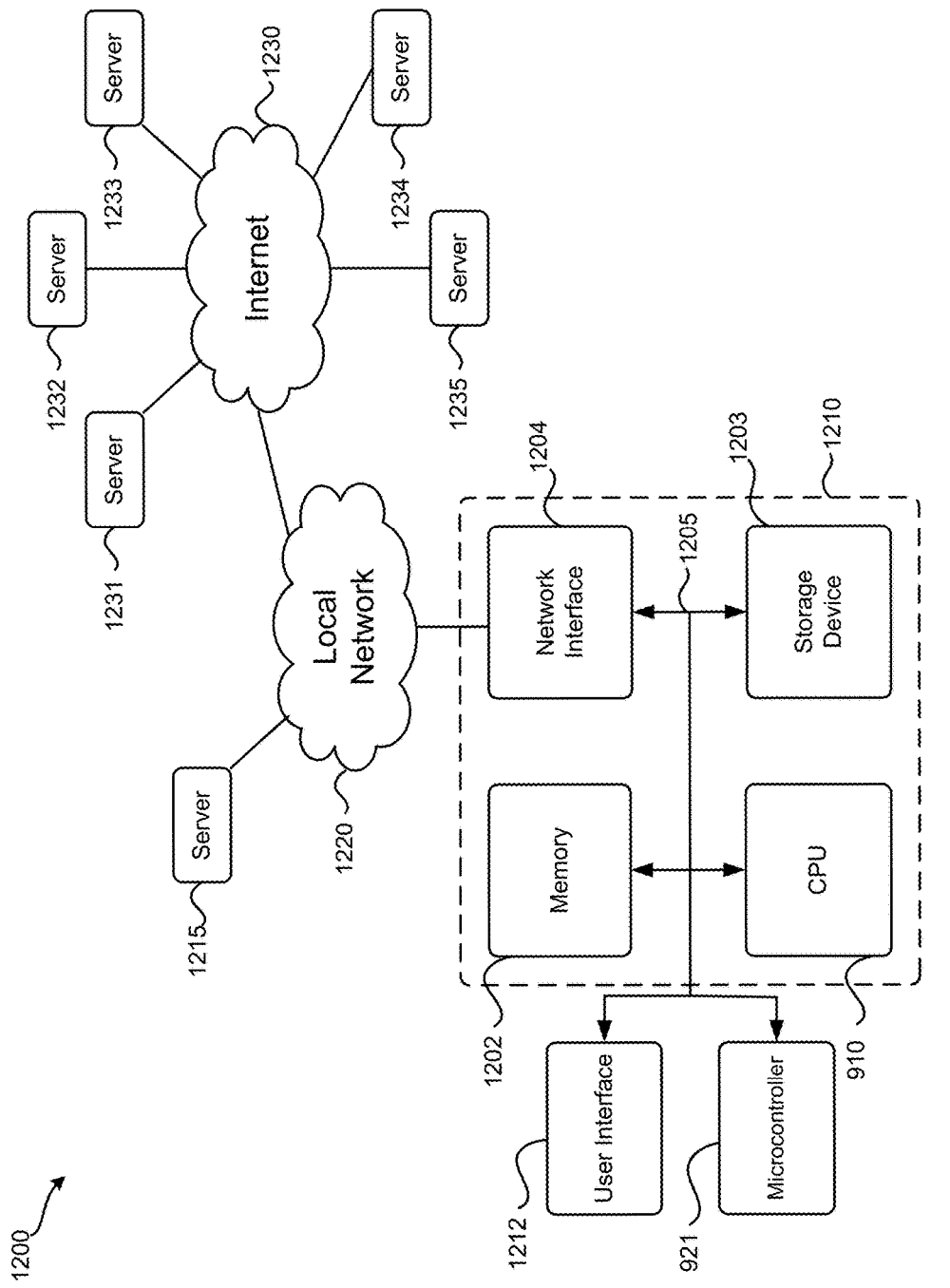
FIG. 12 illustrates a computer system that can use and be used to implement embodiments of the present disclosure.

FIG. 12 illustrates an example computing device and networks that may use or be used to implement embodiments of the present disclosure. Computing device 1210 includes a bus 1205 or other communication mechanism for communicating information, and a processor 910 coupled with bus 1205 for processing information. Computing device 1210 also includes a memory 1202 coupled to bus 1205 for storing information and instructions to be executed by processor 910, including instructions for performing the techniques described above. This memory may also be used for storing temporary variables or other intermediate information during execution of instructions to be executed by processor 910. Possible implementations of this memory may be, but are not limited to, random access memory (RAM), read only memory (ROM), or both. A storage device 1203 is also provided for storing information and instructions. The information instructions can be in the form of computer readable code stored on the storage device, accessible and executable by processor to implement various techniques and methods of the present disclosure. Common forms of storage devices include non-transitory, non-volatile computer readable media, for example, a hard drive, a magnetic disk, an optical disk, a CD, a DVD, a flash memory, a USB memory card, or any other medium from which a computer can read.

Computing device 1210 may be coupled via the same or different information bus, such as bus 1205, to a user interface device 1212, such as a touchscreen, a liquid crystal display (LCD), and LED display, and the like, for displaying information and accepting user input. A microcontroller 921 or microcontroller interface is coupled to the bus 1205 for communicating control signals from the processor 910 to one or more variable equalizer 510. The combination of these components allows the user to communicate with the system and the system to communicate with a circuit or device that includes a variable equalizer 510.

Computing device 1210 also includes a network interface 1204 coupled with bus 1205. Network interface 1204 may provide two-way data communication between computing device 1210 and the local network 1220. The network interface 1204 may be a local area network (LAN) card to provide a data communication connection to a compatible LAN. The LAN card may include a wireless LAN (WLAN) card for communicating with a corresponding wireless network. In any such implementation, network interface 1204 sends and receives signals that carry digital data streams representing various types of information.

Computing device 1210 can send and receive information, including messages or other interface actions, through the network interface 1204 to an Intranet or the Internet 1230. In some embodiments, the network interface 1204 and/or the local network 1220 can communicate with system 100 of FIG. 1 to send and receive signals with any of servers. For example, communication between computing device 1210 and any of the servers 1215, and 1231 to 1235 can be accomplished using one or more instances of system 100. The same instances of system 100 may also be used for communication between any two servers 1231 to 1235.

The above description illustrates various embodiments of the present disclosure along with examples of how aspects of the present disclosure may be implemented. The above examples and embodiments should not be deemed to be the only embodiments, and are presented to illustrate the flexibility and advantages of the present disclosure as defined by the following claims. Based on the above disclosure and the following claims, other arrangements, embodiments, implementations and equivalents will be evident to those skilled in the art and may be employed without departing from the spirit and scope of the invention as defined by the claims.

What is claimed is:

1. A circuit comprising:
   a variable gain compensation circuit to establish a variable frequency-dependent gain, the variable gain compensation circuit including a variable gain compensation device comprising:
   an input terminal;
   an output terminal;
   a first circuit element coupled between a first pair of switches to selectively form a first signal path;
   a second circuit element of a different type than the first circuit element and coupled between a second pair of switches to selectively form a second signal path; and
   a control circuit comprising an input terminal and coupled to the variable gain compensation circuit, wherein the control circuit is configured to control the first and second pair of switches to establish one or more of the first and second signal paths and generate the variable frequency-dependent gain between the input terminal and the output terminal of the variable gain compensation device in response to a signal received on the input terminal of the control circuit from an external source, and wherein the control circuit is further configured to selectively close the first and second pair of switches together to establish both the first and second signal paths.

2. The circuit of claim 1, wherein the first signal path and the second signal path are each between the input terminal and the output terminal of the variable gain compensation device.

3. The circuit of claim 2, wherein the first signal path is in parallel with the second signal path.

4. The circuit of claim 1, wherein the variable gain compensation device further comprises a third circuit element along a third signal path.

5. The circuit of claim 4, wherein the third circuit element is an amplifier.

6. The circuit of claim 1, wherein:
   the variable gain compensation device further includes a third circuit element coupled between a third pair of switches to selectively form a third signal path, the third circuit element different than each of the first circuit element and the second circuit element; and the control circuit is further configured to control the third pair of switches to generate the variable frequency-dependent gain of the variable gain compensation circuit.

7. The circuit of claim 6, wherein the first, second and third signal paths are in parallel between the input terminal and the output terminal of the variable gain compensation device.

8. The circuit of claim 6, wherein the first circuit element is an inductor, the second circuit element is a capacitor, and the third circuit element is a resistor.

9. The circuit of claim 1, wherein closing the first pair of switches and opening the second pair of switches establishes the first signal path and precludes the second signal path to form a first frequency-dependent profile of the variable frequency-dependent gain, and opening the first pair of switches and closing the second pair of switches precludes the first signal path and establishes the second signal path to form a second frequency-dependent profile of the variable frequency-dependent gain, the second frequency-dependent profile different than the first frequency-dependent profile.

10. The circuit of claim 9, wherein closing the first pair of switches and closing the second pair of switches establishes the first signal path and the second signal path to form a third frequency-dependent profile of the variable frequency-dependent gain, the third frequency-dependent profile different than each of the first frequency-dependent profile and the second frequency-dependent profile.

11. The circuit of claim 10, wherein at least one of the first, second and third frequency-dependent profiles corresponds to a polynomial having an order greater than one.

12. The circuit of claim 1, wherein each of the first and second circuit elements are passive elements.

13. The circuit of claim 1, wherein the first signal path consists of the first pair of switches and the first circuit element.

14. The circuit of claim 1, wherein the variable gain compensation device is a first variable gain compensation device, and the variable gain compensation circuit further includes a second variable gain compensation device.

15. The circuit of claim 14, wherein the second variable gain compensation device and the first variable gain compensation device are the same.

16. The circuit of claim 1, wherein the control circuit further comprises a register, and wherein the control circuit establishes a control signal to control the variable frequency-dependent gain of the variable gain compensation circuit in accordance with a predetermined setting stored in the register.

17. The circuit of claim 1, wherein the variable gain compensation device comprises a plurality of M possible configurations to establish a plurality of M corresponding discrete frequency-dependent gains.

* * * * *